(12) United States Patent
Kim et al.

(10) Patent No.: US 12,477,797 B2
(45) Date of Patent: Nov. 18, 2025

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Ki Hwan Kim, Suwon-si (KR); Kyungho Kim, Suwon-si (KR); Kang Hun Moon, Suwon-si (KR); Choeun Lee, Suwon-si (KR); Yonguk Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 424 days.

(21) Appl. No.: 18/100,233

(22) Filed: Jan. 23, 2023

(65) Prior Publication Data

US 2023/0387205 A1 Nov. 30, 2023

(30) Foreign Application Priority Data

May 31, 2022 (KR) ........................ 10-2022-0066973

(51) Int. Cl.
*H01L 29/08* (2006.01)
*H01L 29/66* (2006.01)
*H10D 62/13* (2025.01)
*H10D 64/01* (2025.01)

(52) U.S. Cl.
CPC ......... *H10D 62/151* (2025.01); *H10D 64/021* (2025.01)

(58) Field of Classification Search
CPC ............. H10D 30/014; H10D 30/6219; H10D 30/6713; H10D 30/6735; H10D 30/797; H10D 62/021; H10D 62/118; H10D 62/119; H10D 62/121; H10D 62/149; H10D 62/151; H10D 84/013; H10D 84/017
See application file for complete search history.

(56) References Cited

U.S. PATENT DOCUMENTS

| | | | |
|---|---|---|---|
| 10,825,919 B2 | 11/2020 | Lin et al. | |
| 10,923,598 B2 | 2/2021 | Wang et al. | |
| 11,233,122 B2 | 1/2022 | Kim et al. | |
| 11,239,359 B2 | 2/2022 | Zhang et al. | |
| 12,040,405 B2 * | 7/2024 | Lin ..................... | H10D 64/017 |
| 2002/0149031 A1 | 10/2002 | Kim et al. | |
| 2005/0272231 A1 | 12/2005 | Yun et al. | |
| 2019/0081155 A1 | 3/2019 | Xie et al. | |

(Continued)

FOREIGN PATENT DOCUMENTS

| | | |
|---|---|---|
| KR | 10-0414217 B1 | 1/2004 |
| KR | 10-0618831 B1 | 9/2006 |

*Primary Examiner* — David C Spalla
(74) *Attorney, Agent, or Firm* — Sughrue Mion, PLLC

(57) ABSTRACT

A semiconductor device includes a substrate including an active pattern; a source/drain pattern on the active pattern; a gate electrode on the active pattern; and a gate spacer on the source/drain pattern. The source/drain pattern includes a first semiconductor layer on the active pattern and a second semiconductor layer on the first semiconductor layer. The first semiconductor layer includes a first inner sidewall and second inner sidewall on the second semiconductor layer. A distance between the first and second inner sidewalls of the first semiconductor layer decreases according as positions of two portions of the first semiconductor layer where the distance is measured become closer to the gate spacer decreases.

20 Claims, 25 Drawing Sheets

(56) References Cited

U.S. PATENT DOCUMENTS

| | | | |
|---|---|---|---|
| 2021/0013324 A1 | 1/2021 | Kim et al. | |
| 2021/0066477 A1 | 3/2021 | Lee et al. | |
| 2021/0367036 A1 | 11/2021 | Kim et al. | |
| 2021/0376119 A1 | 12/2021 | Wang et al. | |
| 2022/0367728 A1* | 11/2022 | Lin | H10D 30/6715 |
| 2023/0058459 A1* | 2/2023 | More | H10D 30/014 |
| 2023/0064735 A1* | 3/2023 | Lee | H10D 84/0158 |
| 2023/0378298 A1* | 11/2023 | Li | H10D 30/6757 |
| 2023/0378300 A1* | 11/2023 | Chen | H10D 62/121 |

\* cited by examiner

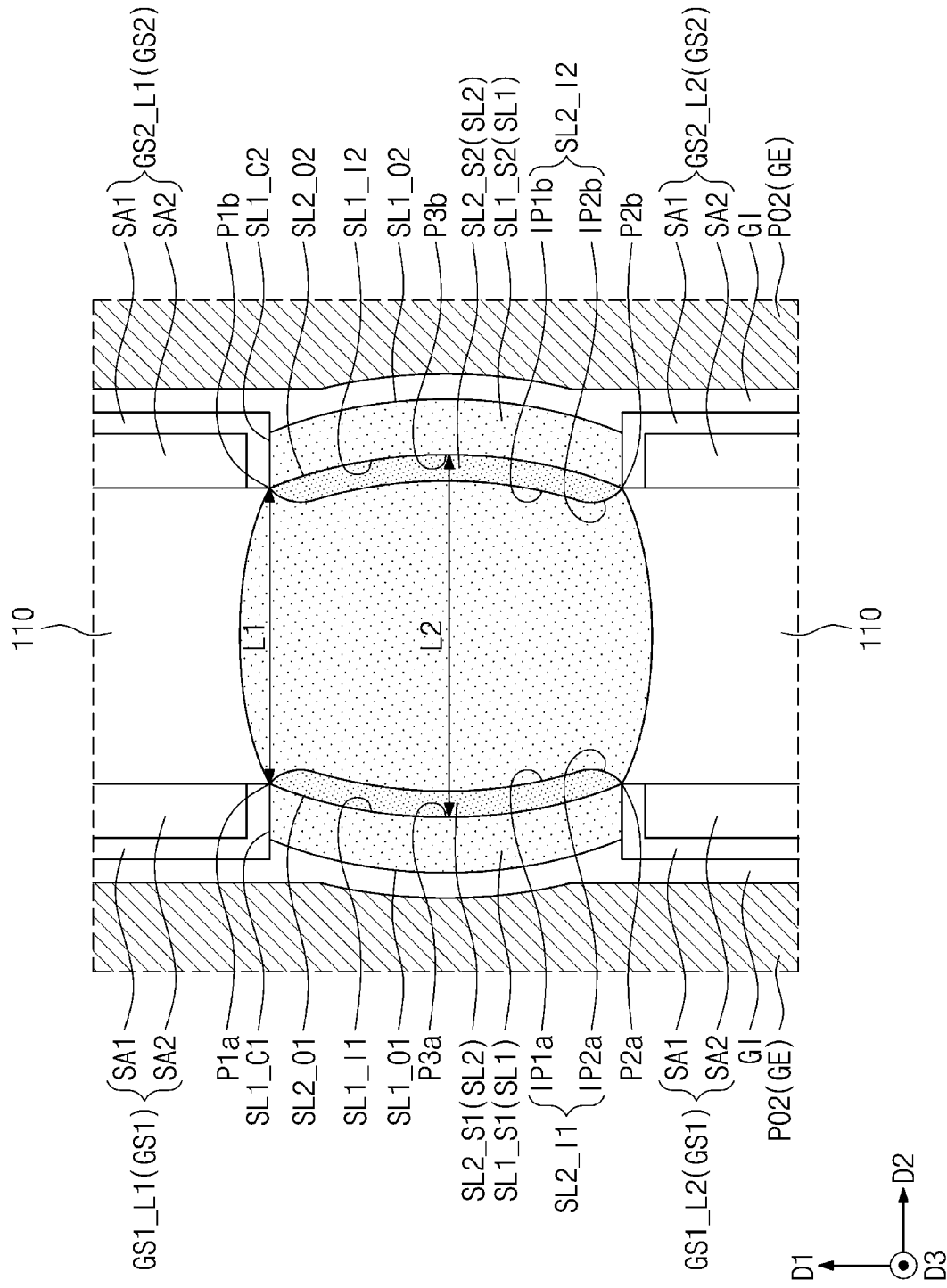

SEMICONDUCTOR DEVICE AND METHOD OF FABRICATING THE SAME

CROSS-REFERENCE TO RELATED APPLICATIONS

This application claims priority to Korean Patent Application No. 10-2022-0066973, filed on May 31, 2022, in the Korean Intellectual Property Office, the disclosure of which is incorporated herein in its entirety by reference.

BACKGROUND

The present disclosure relates to a semiconductor device with source/drain patterns and a method of fabricating the same.

A semiconductor device includes an integrated circuit formed of metal-oxide-semiconductor field-effect transistors (MOSFETs). To meet an increasing demand for the semiconductor device with a small pattern size and a reduced design rule, the MOSFETs are being scaled down. The scale-down of the MOSFETs may lead to deterioration in operation characteristics of the semiconductor device. Accordingly, a variety of studies are being conducted to overcome technical limitations associated with the scale-down of the semiconductor device and provide a high performance semiconductor device.

SUMMARY

An embodiment of the disclosure provides a semiconductor device with improved electrical and reliability characteristics and a method of fabricating the same.

According to an embodiment, a semiconductor device may include a substrate including an active pattern, a source/drain pattern on the active pattern, a gate electrode on the active pattern, and a gate spacer on the source/drain pattern. The source/drain pattern may include a first semiconductor layer on the active pattern and a second semiconductor layer on the first semiconductor layer. The first semiconductor layer may include a first inner sidewall and a second inner sidewall on the second semiconductor layer. A distance between the first and second inner sidewalls of the first semiconductor layer may decrease according as positions of two portions of the first semiconductor layer where the distance is measured become closer to the gate spacer decreases.

According to an embodiment, a semiconductor device may include a substrate including an active pattern, semiconductor patterns on the active pattern, a first semiconductor layer on the semiconductor patterns, a second semiconductor layer on the first semiconductor layer, and a gate electrode overlapping the semiconductor patterns. The first semiconductor layer may include an inner sidewall on the second semiconductor layer, and the inner sidewall of the first semiconductor layer may have a convex shape in an opposite direction of the second semiconductor layer.

According to an embodiment, a semiconductor device may include a substrate comprising a first active pattern and a second active pattern, a first source/drain pattern on the first active pattern, a second source/drain pattern on the second active pattern, a first gate spacer on the first and second source/drain patterns, and a second gate spacer on the first and second source/drain patterns. The first gate spacer may include an upper portion and first and second lower portions, which are spaced apart from each other with the first source/drain pattern interposed therebetween, and the second gate spacer may include an upper portion and first and second lower portions, which are spaced apart from each other with the first source/drain pattern interposed therebetween. The first source/drain pattern may include a first semiconductor layer on the first active pattern and a second semiconductor layer on the first semiconductor layer. The first semiconductor layer may include a first inner sidewall and a second inner sidewall on the second semiconductor layer. The first inner sidewall of the first semiconductor layer may include a first portion on the first lower portion of the first gate spacer, a second portion on the second lower portion of the first gate spacer, and a third portion between the first and second portions of the first inner sidewall of the first semiconductor layer. The second inner sidewall of the first semiconductor layer may include a first portion on the first lower portion of the second gate spacer, a second portion on the second lower portion of the second gate spacer, and a third portion between the first and second portions of the second inner sidewall of the first semiconductor layer. A distance between the first portion of the first inner sidewall of the first semiconductor layer and the first portion of the second inner sidewall of the first semiconductor layer may be smaller than a distance between the third portion of the first inner sidewall of the first semiconductor layer and the third portion of the second inner sidewall of the first semiconductor layer.

According to an embodiment, a method of fabricating a semiconductor device may include forming a stacking pattern on a substrate, the stacking pattern including active layers and sacrificial layers, which are alternately stacked, forming a sacrificial pattern on the stacking pattern, etching the stacking pattern using the sacrificial pattern as a mask to form a recess in the stacking pattern, the active layers, which are cut by the recess, being defined as semiconductor patterns, and forming a source/drain pattern in the recess. The forming the source/drain pattern may include forming a first semiconductor layer on the sacrificial layers and the semiconductor patterns exposed by the recess and forming a second semiconductor layer on the first semiconductor layer. A process temperature in a first process of forming the first semiconductor layer may be lower than a process temperature in a second process of forming the second semiconductor layer, and a process pressure in the first process may be higher than a process pressure in the second process.

BRIEF DESCRIPTION OF DRAWINGS

FIG. 1G is a diagram illustrating a structure taken at a level F of FIG. 1F.

DETAILED DESCRIPTION

The embodiments described herein are example embodiments, and thus, the inventive concept is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Spatially relative terms, such as "over," "above," "on," "upper," "below," "under," "beneath," "lower," "left," "right," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1A:
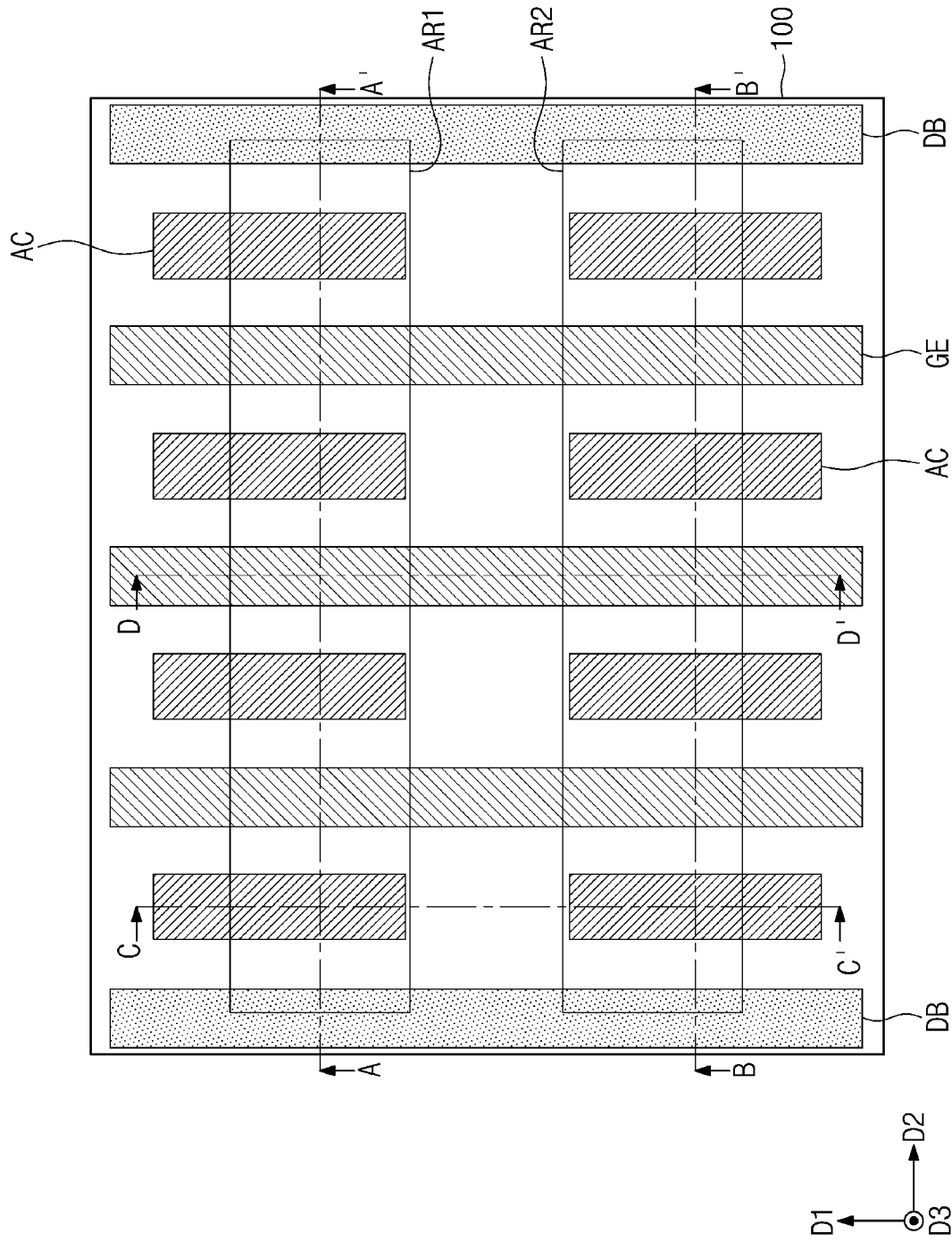
FIG. 1A is a plan view illustrating a semiconductor device according to an embodiment.
Figure 1B:
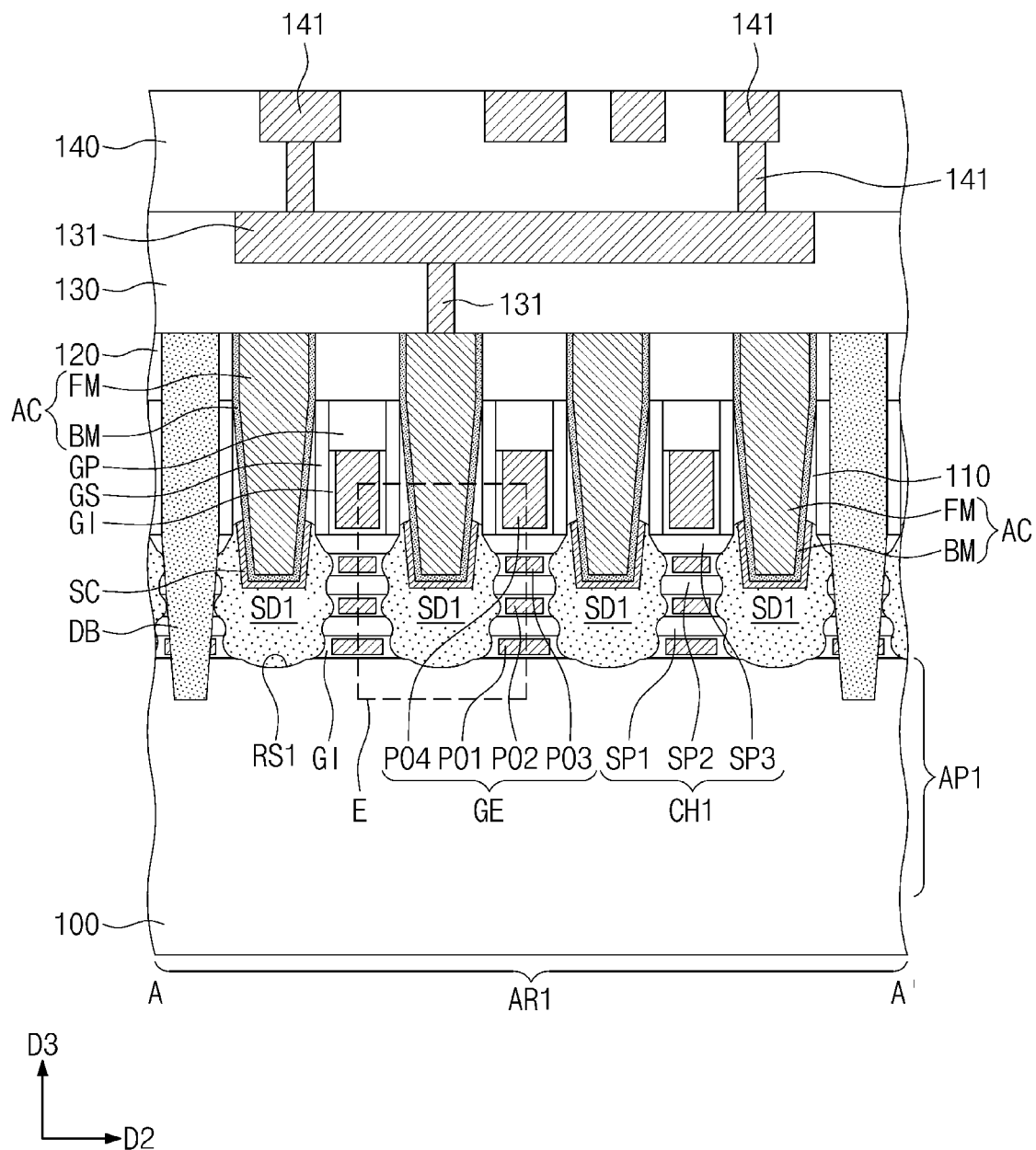
FIG. 1B is a sectional view taken along a line A-A' of FIG. 1A.
Figure 1C:
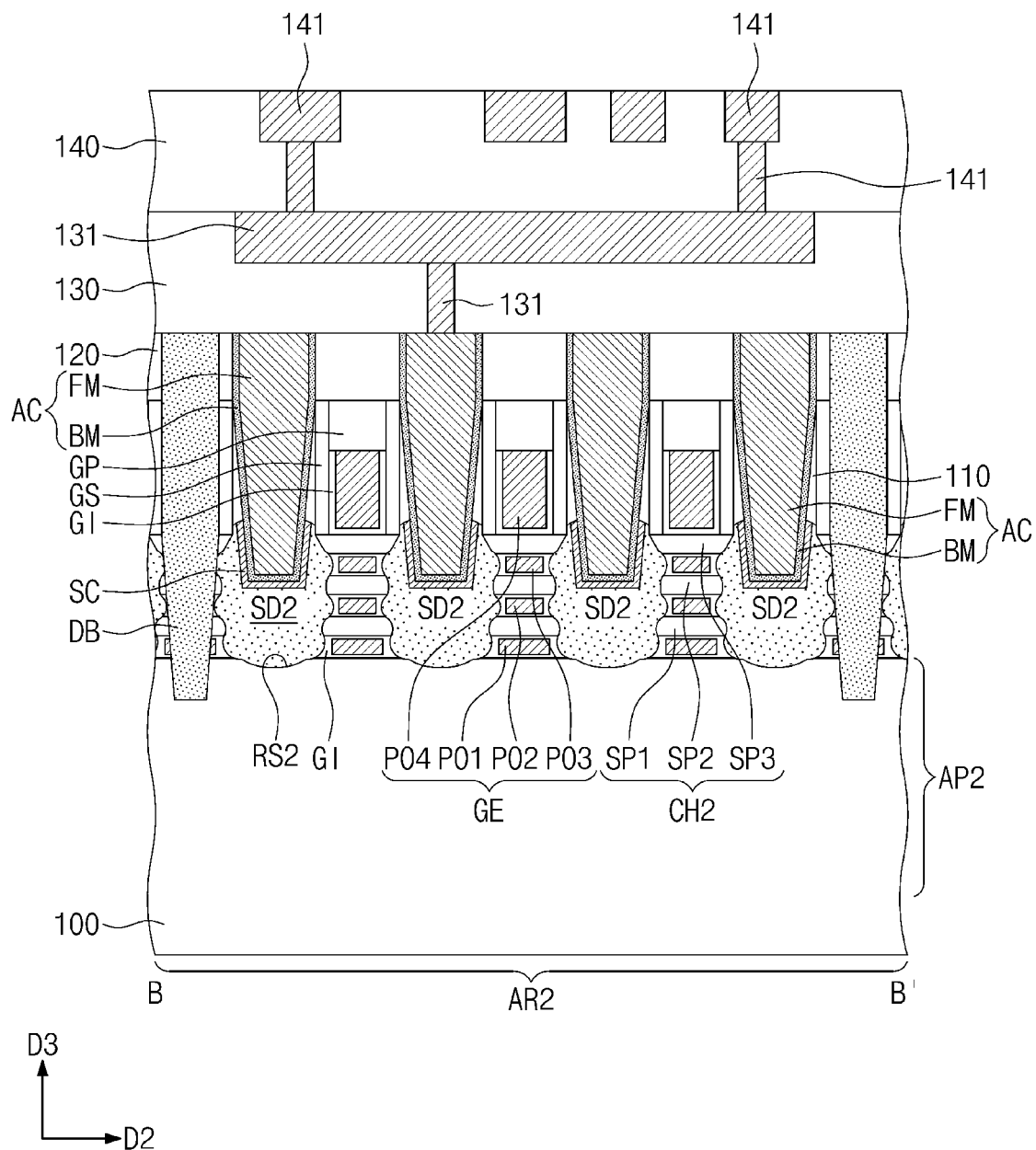
FIG. 1C is a sectional view taken along a line B-B' of FIG. 1A.
Figure 1D:
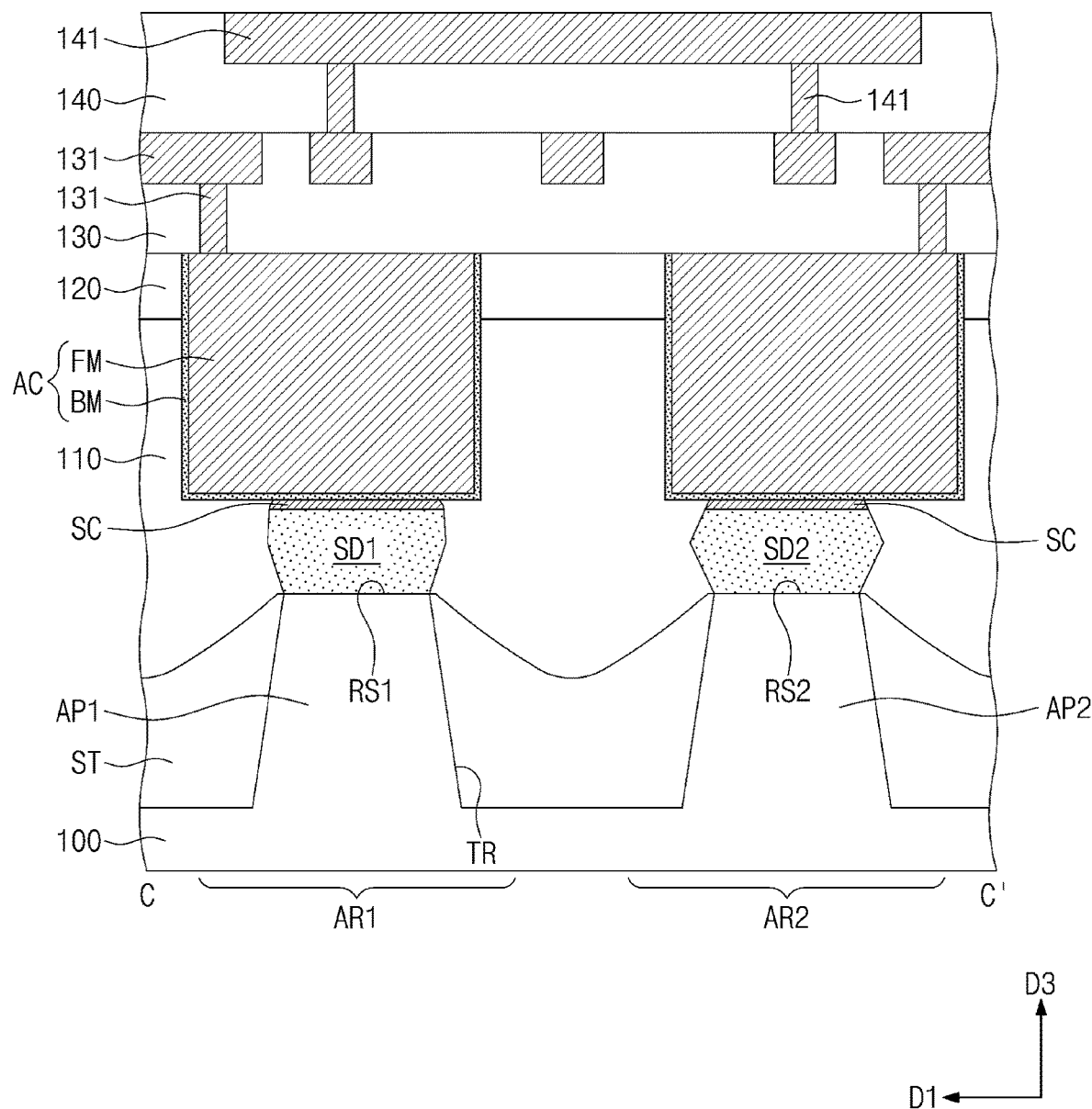
FIG. 1D is a sectional view taken along a line C-C' of FIG. 1A.
Figure 1E:
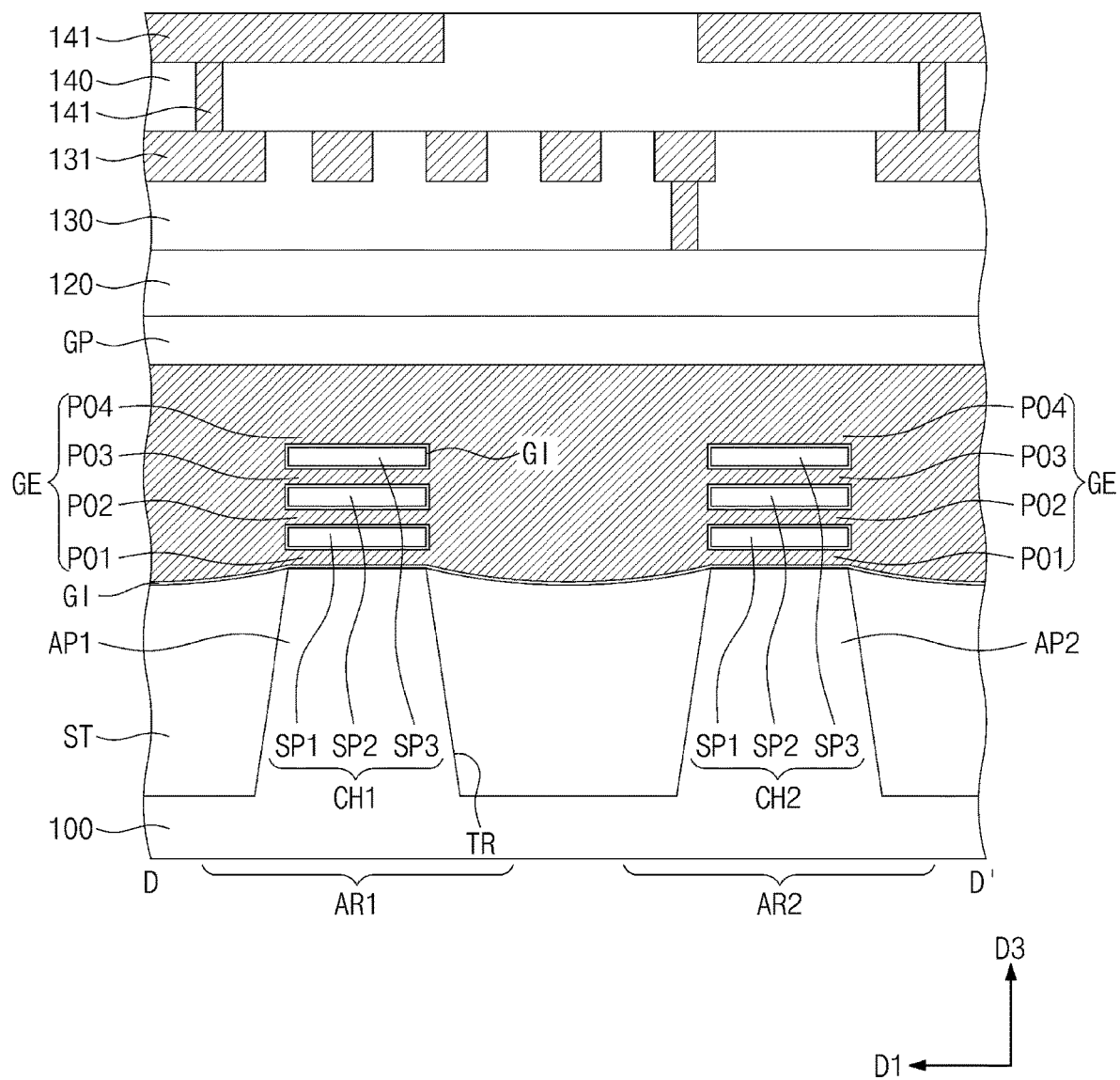
FIG. 1E is a sectional view taken along a line D-D' of FIG. 1A.
Figure 1F:
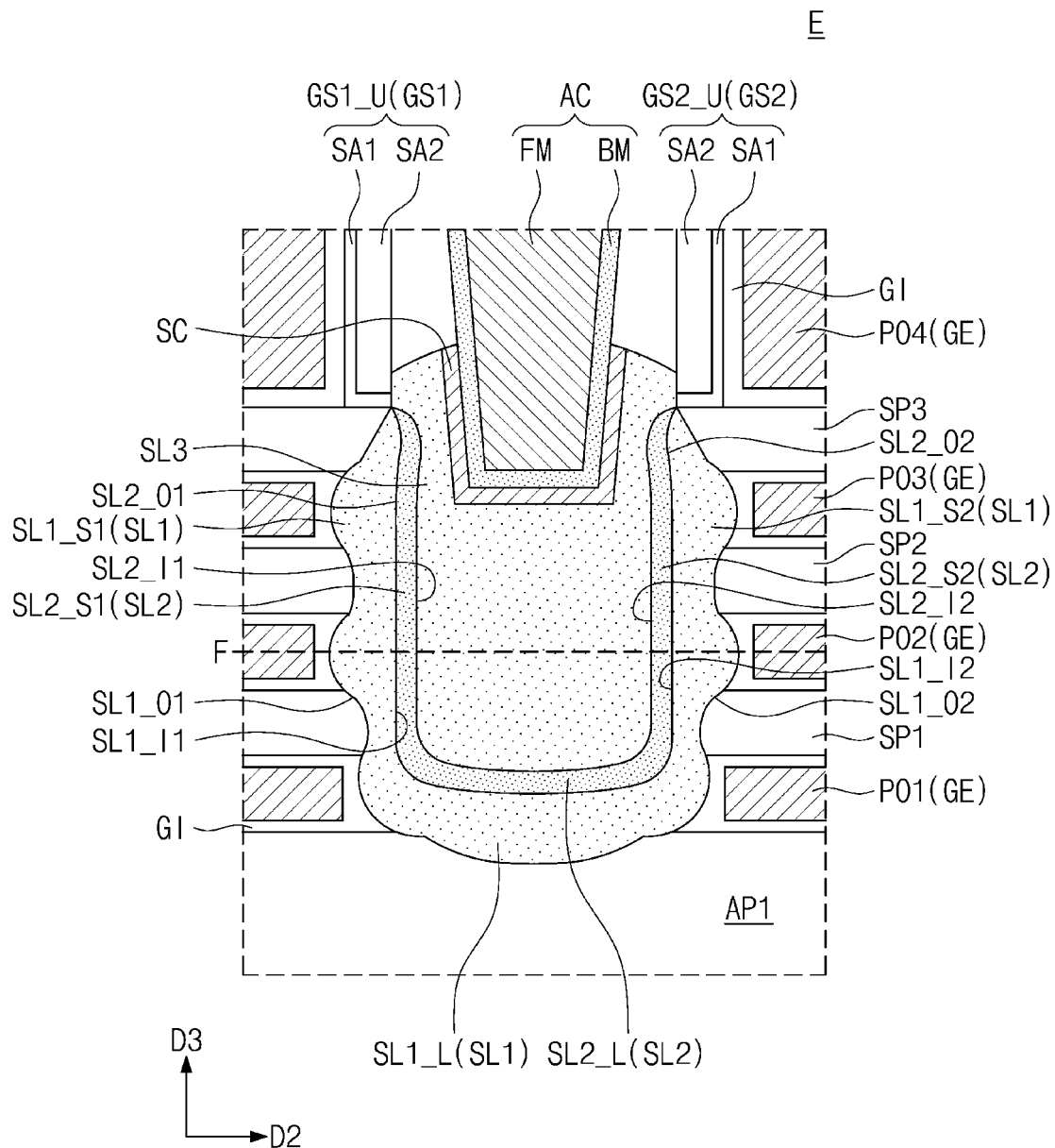
FIG. 1F is an enlarged sectional view illustrating a portion E of FIG. 1B.

FIG. 1A is a plan view illustrating a semiconductor device according to an embodiment. FIG. 1B is a sectional view taken along a line A-A' of FIG. 1A. FIG. 1C is a sectional view taken along a line B-B' of FIG. 1A. FIG. 1D is a sectional view taken along a line C-C' of FIG. 1A. FIG. 1E is a sectional view taken along a line D-D' of FIG. 1A. FIG. 1F is an enlarged sectional view illustrating a portion E of FIG. 1B. FIG. 1G is a diagram illustrating a structure taken at a level F of FIG. 1F.

Referring to FIGS. 1A, 1B, 1C, 1D and 1E, the semiconductor device may include a substrate 100. Logic transistors constituting a logic circuit may be disposed on the substrate 100. In an embodiment, the substrate 100 may be a semiconductor substrate. As an example, the substrate 100 may be formed of or include at least one of silicon, germanium, silicon-germanium, gallium phosphide GaP or gallium arsenide (GaAs). In an embodiment, the substrate 100 may be a silicon-on-insulator (SOI) substrate or a germanium-on-insulator (GOI) substrate. The substrate 100 may be a plate-shaped structure that is extended in a first direction D1 and a second direction D2. The first and second directions D1 and D2 may not be parallel to each other. As an example, the first and second directions D1 and D2 may be horizontal directions that are not parallel to each other.

The substrate 100 may include a first active region AR1 and a second active region AR2. Each of the first and second active regions AR1 and AR2 may be extended in the second direction D2. In an embodiment, the first active region AR1 may be an n-type MOSFET (NMOS) region, and the second active region AR2 may be a p-type MOSFET (PMOS) region.

The substrate 100 may include a first active pattern AP1 and a second active pattern AP2. The first active pattern AP1 and the second active pattern AP2 may be defined by a trench TR on the substrate 100. The first active pattern AP1 may be provided on the first active region AR1, and the second active pattern AP2 may be provided on the second active region AR2. The first and second active patterns AP1 and AP2 may be extended in the second direction D2. The first and second active patterns AP1 and AP2 may be portions protruding in a third direction D3. The third direction D3 may not be parallel to both of the first and second directions D1 and D2. As an example, the third direction D3 may be a vertical direction that is orthogonal to the first and second directions D1 and D2.

A device isolation layer ST may be provided on the substrate 100. The device isolation layer ST may fill the trench TR. The device isolation layer ST may be formed of or include an insulating material. For example, the device isolation layer ST may be formed of or include an oxide material such as silicon oxide. The device isolation layer ST may not cover first and second channel patterns CH1 and CH2 to be described below.

The first channel patterns CH1 may be provided above the first active pattern AP1. The second channel patterns CH2 may be provided above the second active pattern AP2. Each of the first and second channel patterns CH1 and CH2 may include a first semiconductor pattern SP1, a second semiconductor pattern SP2, and a third semiconductor pattern SP3, which are sequentially arranged in the third direction D3. The first to third semiconductor patterns SP1, SP2 and SP3 may be spaced apart from each other in the third direction D3.

In an embodiment, the first to third semiconductor patterns SP1, SP2 and SP3 may be formed of or include silicon (Si). For example, each of the first to third semiconductor patterns SP1, SP2 and SP3 may be formed of or include crystalline silicon. In an embodiment, the first to third semiconductor patterns SP1, SP2 and SP3 may be formed of or include silicon-germanium (SiGe).

A plurality of first source/drain patterns SD1 may be provided on the first active pattern AP1. A plurality of first recesses RS1 may be formed on the first active pattern AP1. The first source/drain patterns SD1 may be provided in the first recesses RS1, respectively. The first channel pattern CH1 may be formed between adjacent ones of the first source/drain patterns SD1. In other words, the first to third semiconductor patterns SP1, SP2 and SP3, which are arranged in the third direction D3, may be provided to connect adjacent ones of the first source/drain patterns SD1 to each other.

A plurality of second source/drain patterns SD2 may be provided on the second active pattern AP2. A plurality of second recesses RS2 may be formed on the second active pattern AP2. The second source/drain patterns SD2 may be provided in the second recesses RS2, respectively. The second channel pattern CH2 may be formed between adjacent ones of the second source/drain patterns SD2. In other words, the first to third semiconductor patterns SP1, SP2 and SP3, which are arranged in the third direction D3, may be provided to connect adjacent ones of the second source/drain patterns SD2 to each other.

In an embodiment, the second source/drain pattern SD2 may include a low concentration semiconductor layer and a high concentration semiconductor layer thereon. The low concentration semiconductor layer may be formed on the first to third semiconductor patterns SP1, SP2 and SP3, and the high concentration semiconductor layer may be spaced apart from the first to third semiconductor patterns SP1, SP2 and SP3. The low and high concentration semiconductor layers may include at least one of the Group 13 and 14 elements. The low and high concentration semiconductor layers may include an extrinsic semiconductor material. The low and high concentration semiconductor layers may be formed of or include one or more p-type semiconductor materials, in which one or more Group 13 elements are doped. As an example, the low and high concentration semiconductor layers may include a SiGe layer (e.g., a SiGeB, SiGeGa, or SiGeIn layer) doped with one or more types of impurity such as boron (B), gallium (Ga) and indium (In). An impurity concentration of the low concentration semiconductor layer may be lower than an impurity concentration of the high concentration semiconductor layer.

The first and second source/drain patterns SD1 and SD2 may be epitaxial patterns, which are formed by a selective epitaxial growth (SEG) process. In an embodiment, a top surface of each of the first and second source/drain patterns SD1 and SD2 may be higher than a top surface of the third semiconductor pattern SP3. As an example, a level of the top surface of each of the first and second source/drain patterns SD1 and SD2 may be higher than a level of the top surface of the third semiconductor pattern SP3 by 5 nm or less. In an embodiment, the top surface of each of the first and second source/drain patterns SD1 and SD2 may be lower than the top surface of the third semiconductor pattern SP3. As an example, the level of the top surface of each of the first and second source/drain patterns SD1 and SD2 may be lower than the level of the top surface of the third semiconductor pattern SP3 by 2 nm or less. In an embodiment, the top surface of each of the first and second source/drain patterns SD1 and SD2 may be at the same level as the top surface of the third semiconductor pattern SP3.

Gate electrodes GE may be provided to extend in the first direction D1 and to cross the first and second channel patterns CH1 and CH2. The gate electrodes GE may be arranged at a first pitch in the second direction D2. Each of the gate electrodes GE may be overlapped with the first to third semiconductor patterns SP1, SP2 and SP3 of each of the first and second channel patterns CH1 and CH2 in the third direction D3. In an embodiment, a proximity between the source/drain pattern SD1 or SD2 and the gate electrode GE, which are adjacent to each other, may range from 0 nm to 10 nm.

The gate electrode GE may include a first portion PO1, which is interposed between the active pattern AP1 or AP2 and the first semiconductor pattern SP1, a second portion PO2, which is interposed between the first semiconductor pattern SP1 and the second semiconductor pattern SP2, a third portion PO3, which is interposed between the second semiconductor pattern SP2 and the third semiconductor pattern SP3, and a fourth portion PO4, which is provided above the third semiconductor pattern SP3. The gate electrode GE may include a conductive material.

The gate electrode GE and the first to third semiconductor patterns SP1, SP2 and SP3, which are three-dimensionally enclosed by the gate electrode GE, may constitute a three-dimensional field effect transistor (3DFET) such as multi-bridge channel field-effect transistor (MBCFET) or gate-all-around field-effect transistor (GAAFET).

A pair of gate spacers GS may be respectively disposed on opposite side surfaces of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below.

A gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. For example, the gate capping pattern GP may be formed of or include a nitride material such as silicon nitride.

Gate dielectric layers GI may be provided on the gate electrode GE. The gate dielectric layer GI may be provided to three-dimensionally enclose the first to third semiconductor patterns SP1, SP2 and SP3. The gate dielectric layer GI may be formed on the device isolation layer ST. The gate dielectric layer GI may be formed of or include an insulating material. As an example, the gate dielectric layer GI may be formed of or include one or more oxide materials such as silicon oxide and hafnium oxide.

A first interlayer insulating layer 110 may be provided on the gate spacers GS and the first and second source/drain patterns SD1 and SD2. A top surface of the first interlayer insulating layer 110 may be coplanar with a top surface of the gate capping pattern GP and a top surface of the gate spacer GS. A second interlayer insulating layer 120 may be provided on the first interlayer insulating layer 110 and the gate capping pattern GP. A third interlayer insulating layer 130 may be provided on the second interlayer insulating layer 120. A fourth interlayer insulating layer 140 may be provided on the third interlayer insulating layer 130. The first to fourth interlayer insulating layers 110, 120, 130 and 140 may be formed of or include at least one of insulating materials. For example, the first to fourth interlayer insulating layers 110, 120, 130 and 140 may be formed of or include an oxide material such as silicon oxide.

Division structures DB may be provided. The division structure DB may be extended in the first direction D1. The gate electrodes GE may be disposed between the division structures DB. A pitch between the division structure DB and the gate electrode GE adjacent thereto may be equal to the first pitch.

The division structure DB may be provided to penetrate the first and second interlayer insulating layers 110 and 120, and may be extended into the first and second active patterns AP1 and AP2. The division structure DB may include a lower portion that is provided to penetrate an upper portion of each of the first and second active patterns AP1 and AP2 in the first direction D1.

Active contacts AC may be provided to penetrate the first and second interlayer insulating layers 110 and 120, and may be electrically connected to the first and second source/drain patterns SD1 and SD2, respectively. The gate electrode GE may be provided between adjacent ones of the active contacts AC. When viewed in a plan view, the active contact AC may be a bar-shaped pattern extended in the first direction D1. For example, the active contact AC may be formed on at least a portion of a side surface of the gate spacer GS.

Metal-semiconductor compound layers SC may be provided. The metal-semiconductor compound layer SC may be interposed between the active contact AC and the first source/drain pattern SD1 or between the active contact AC and the second source/drain pattern SD2.

The active contact AC may be electrically connected to the source/drain pattern SD1 or SD2 through the metal-semiconductor compound layer SC. For example, the metal-semiconductor compound layer SC may be formed of or include at least one of titanium-silicide, tantalum-silicide, tungsten-silicide, nickel-silicide, or cobalt-silicide.

The active contact AC may include a conductive pattern FM and a barrier pattern BM on the conductive pattern FM. For example, the conductive pattern FM may be formed of or include at least one of aluminum, copper, tungsten, molybdenum, or cobalt. The barrier pattern BM may be formed on side and bottom surfaces of the conductive pattern FM. The barrier pattern BM may include at least one of a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

First conductive structures 131 may be provided in the third interlayer insulating layer 130. The first conductive structures 131 may include conductive contacts and conductive lines. The first conductive structures 131 may be formed of or include a conductive material. At least some of the first conductive structures 131 may be electrically connected to the active contact AC.

Second conductive structures 141 may be provided in the fourth interlayer insulating layer 140. The second conductive structures 141 may include conductive contacts and conductive lines. The second conductive structures 141 may be formed of or include a conductive material. At least some of the second conductive structures 141 may be electrically connected to the first conductive structures 131.

In an embodiment, referring to FIGS. 1F and 1G, the gate spacer GS may include a first spacer layer SA1 and a second spacer layer SA2. The first spacer layer SA1 may be provided on the gate dielectric layer GI. The second spacer layer SA2 may be provided on the first spacer layer SA1. The first and second spacer layers SA1 and SA2 may be formed of or include an insulating material. As an example, the first and second spacer layers SA1 and SA2 may be formed of or include a nitride material such as silicon nitride. In an embodiment, a dielectric constant of the first spacer layer SA1 may be higher than a dielectric constant of the second spacer layer SA2.

A pair of gate spacers GS may be formed on one of the first source/drain patterns SD1. The pair of gate spacers GS, which are formed on one of the first source/drain patterns SD1, may be defined as a first gate spacer GS1 and a second gate spacer GS2. The first and second gate spacers GS1 and GS2 may be spaced apart from each other in the second direction D2 with the first source/drain pattern SD1 interposed therebetween.

The first gate spacer GS1 may include an upper portion GS1_U and a plurality of lower portions GS1_L1 and GS1_L2. The upper portion GS1_U of the first gate spacer GS1 may be a portion that is located at a level higher than a top surface of the uppermost semiconductor pattern (i.e., the third semiconductor pattern SP3). The lower portions GS1_L1 and GS1_L2 of the first gate spacer GS1 may be portions that are located at a level lower than the top surface of the uppermost semiconductor pattern. The lower portions GS1_L1 and GS1_L2 of the first gate spacer GS1 may be arranged in the first direction D1. The first source/drain pattern SD1 may be provided between adjacent ones of the lower portions GS1_L1 and GS1_L2 of the first gate spacer GS1. The lower portions GS1_L1 and GS1_L2 of two first gate spacers GS1, which are formed on the first source/drain pattern SD1, may be respectively defined as a first lower portion GS1_L1 and a second lower portion GS1_L2 of the first gate spacer GS1. The first and second lower portions GS1_L1 and GS1_L2 of the first gate spacer GS1 may be spaced apart from each other in the first direction D1 with the first source/drain pattern SD1 interposed therebetween.

Similar to the first gate spacer GS1, the second gate spacer GS2 may include an upper portion GS2_U and a plurality of lower portions GS2_L1 and GS2_L2. The lower portions GS2_L1 and GS2_L2 of two second gate spacers GS2, which are formed on the first source/drain pattern SD1, may be respectively defined as a first lower portion GS2_L1 and a second lower portion GS2_L2 of the second gate spacer GS2. The first and second lower portions GS2_L1 and GS2_L2 of the second gate spacer GS2 may be spaced apart from each other in the first direction D1 with the first source/drain pattern SD1 interposed therebetween.

The first lower portion GS1_L1 of the first gate spacer GS1 and the first lower portion GS2_L1 of the second gate spacer GS2 may be spaced apart from each other in the second direction D2 with the first source/drain pattern SD1 interposed therebetween. The second lower portion GS1_L2 of the first gate spacer GS1 and the second lower portion GS2_L2 of the second gate spacer GS2 may be spaced apart from each other in the second direction D2 with the first source/drain pattern SD1 interposed therebetween. The first lower portion GS1_L1 of the first gate spacer GS1 and the first lower portion GS2_L1 of the second gate spacer GS2 may be disposed at a side of the first source/drain pattern SD1, and the second lower portion GS1_L2 of the first gate spacer GS1 and the second lower portion GS2_L2 of the second gate spacer GS2 may be disposed at an opposite side of the first source/drain pattern SD1.

The first source/drain pattern SD1 may include a first semiconductor layer SL1 on the first active pattern AP1, a second semiconductor layer SL2 on the first semiconductor layer SL1, and a third semiconductor layer SL3 on the second semiconductor layer SL2. The first semiconductor layer SL1 may be formed on the first to third semiconductor patterns SP1, SP2 and SP3. The second and third semiconductor layers SL2 and SL3 may be spaced apart from the first to third semiconductor patterns SP1, SP2 and SP3. According to an embodiment, the first, second and third semiconductor layers SL1, SL2 and SL3 may have different structures and different material compositions forming thereof, respectively, as will be described below.

The first semiconductor layer SL1 may include a lower portion SL1_L, a first sidewall portion SL1_S1, and a second sidewall portion SL1_S2. The lower portion SL1_L of the first semiconductor layer SL1 may connect the first and second sidewall portions SL1_S1 and SL1_S2 of the first semiconductor layer SL1 to each other. In an embodiment, a thickness of the first semiconductor layer SL1 may range from 5 nm to 20 nm.

The second semiconductor layer SL2 may include a lower portion SL2_L, a first sidewall portion SL2_S1, and a second sidewall portion SL2_S2. The lower portion SL2_L of the second semiconductor layer SL2 may connect the first and second sidewall portions SL2_S1 and SL2_S2 of the second semiconductor layer SL2 to each other. The first sidewall portion SL2_S1 of the second semiconductor layer SL2 may be formed on a first inner sidewall SL1_I1 of the first semiconductor layer SL1, which will be described below. The second sidewall portion SL2_S2 of the second semiconductor layer SL2 may be formed on a second inner sidewall SL1_I2 of the first semiconductor layer SL1, which will be described below. The second semiconductor layer SL2 may be provided between the first and second sidewall portions SL1_S1 and SL1_S2 of the first semiconductor layer SL1. The third semiconductor layer SL3 may be provided between the first and second sidewall portions SL2_S1 and SL2_S2 of the second semiconductor layer SL2. The metal-semiconductor compound layer SC may be provided on the third semiconductor layer SL3. A lower portion of the active contact AC may be provided in the third semiconductor layer SL3.

In an embodiment, each of the second and third semiconductor layers SL2 and SL3 may include a void. As an example, a volume ratio of the void in each of the second and third semiconductor layers SL2 and SL3 may be less than or equal to 2%.

The first semiconductor layer SL1 may include at least one of the Group 14 elements. The first semiconductor layer SL1 may be an intrinsic semiconductor material that is not doped with an element, which is not included in the Group 14 elements, as an impurity. As an example, the first semiconductor layer SL1 may be formed of or include at least one of Si, SiGe, SiC, or SiGeC. In the case where the first semiconductor layer SL1 includes SiC or SiGeC, a concentration of carbon (C) may be smaller than 0.5%. In the case where the first semiconductor layer SL1 includes SiGe or SiGeC, a concentration of germanium (Ge) may smaller than or equal to 10%.

The second semiconductor layer SL2 may include at least one of the Group 14 and 15 elements. The second semiconductor layer SL2 may include an extrinsic semiconductor material. The second semiconductor layer SL2 may be formed of or include one or more n-type semiconductor materials, which are doped with at least one of the Group 15 elements. As an example, the second semiconductor layer SL2 may include a Si layer (e.g., a SiAs, SiP, or SiSb layer) doped with arsenic (As), phosphorus (P), or antimony (Sb).

The third semiconductor layer SL3 may include at least one of the Group 14 and 15 elements. The third semiconductor layer SL3 may include an extrinsic semiconductor material. The third semiconductor layer SL3 may be formed of or include one or more n-type semiconductor materials, which are doped with at least one of the Group 15 elements. As an example, the third semiconductor layer SL3 may include a Si layer (e.g., a SiP layer) doped with phosphorus (P). An impurity concentration of the third semiconductor layer SL3 may be higher than an impurity concentration of the second semiconductor layer SL2. For example, a concentration of the impurities doped in the second semiconductor layer SL2 may range from 0.1% to 4%, and a concentration of the impurities doped in the third semiconductor layer SL3 may range from 4% to 12%.

The first semiconductor layer SL1 may include a first outer sidewall SL1_O1, a second outer sidewall SL1_O2, a first inner sidewall SL1_I1, and a second inner sidewall SL1_I2. Each of the first and second outer sidewalls SL1_O1 and SL1_O2 of the first semiconductor layer SL1 may be formed on the gate dielectric layer GI and the semiconductor patterns SP1, SP2 and SP3. The semiconductor patterns SP1, SP2 and SP3, which are formed on the first outer sidewall SL1_O1 of the first semiconductor layer SL1, may be different from the semiconductor patterns SP1, SP2 and SP3, which are formed on the second outer sidewall SL1_O2 of the first semiconductor layer SL1. Each of the first and second inner sidewalls SL1_I1 and SL1_I2 of the first semiconductor layer SL1 may be formed on the second semiconductor layer SL2. The first and second outer sidewalls SL1_O1 and SL1_O2 of the first semiconductor layer SL1 may be spaced apart from each other in the second direction D2. The first and second inner sidewalls SL1_I1 and SL1_I2 of the first semiconductor layer SL1 may be spaced apart from each other in the second direction D2. According to an embodiment, there is no separate inner spacer, for example, a silicon nitride layer, isolating the gate dielectric layer GI from the first semiconductor layer SL1 of an NMOS formed in the first active region AR1.

The first outer and inner sidewalls SL1_O1 and SL1_I1 of the first semiconductor layer SL1 may be formed on the first and second lower portions GS1_L1 and GS1_L2 of the first gate spacer GS1. The second outer and inner sidewalls SL1_O2 and SL1_I2 of the first semiconductor layer SL1 may be formed on the first and second lower portions GS2_L1 and GS2_L2 of the second gate spacer GS2.

A distance, in the second direction D2, between the first and second outer sidewalls SL1_O1 and SL1_O2 of the first semiconductor layer SL1 may be greater than a distance, in the second direction D2, between the first and second inner sidewalls SL1_I1 and SL1_I2 of the first semiconductor layer SL1.

A distance between the first and second outer sidewalls SL1_O1 and SL1_O2 of the first semiconductor layer SL1 may decrease according as positions of two portions of the first semiconductor layer SL1 where the distance is measured become closer to the lower portion GS1_L1, GS1_L2, GS2_L1, or GS2_L2 of the gate spacer GS1 or GS2 adjacent thereto decreases. For example, when viewed in the plan view of FIG. 1G, a distance, in the second direction D2, between portions of the first and second outer sidewalls SL1_O1 and SL1_O2 of the first semiconductor layer SL1, which are adjacent to the first lower portions GS1_L1 and GS2_L1 of the first and second gate spacers GS1 and GS2, may decrease according as positions of the two portions of the first semiconductor layer SL1 where the distance is measured become closer to the first lower portions GS1_L1 and GS2_L1 of the first and second gate spacers GS1 and GS2 decreases.

A distance between the first and second inner sidewalls SL1_I1 and SL1_I2 of the first semiconductor layer SL1 may decrease according as positions of two portions of the first semiconductor layer SL1 where the distance is measured become closer to the lower portion GS1_L1, GS1_L2, GS2_L1, or GS2_L2 of the gate spacer GS1 or GS2 adjacent thereto decreases. For example, when viewed in the plan view of FIG. 1G, a distance, in the second direction D2, between portions of the first and second inner sidewalls SL1_I1 and SL1_I2 of the first semiconductor layer SL1, which are adjacent to the first lower portions GS1_L1 and GS2_L1 of the first and second gate spacers GS1 and GS2 may decrease according as positions of the two portions of the first semiconductor layer SL1 where the distance is measured become closer to the first lower portions GS1_L1 and GS2_L1 of the first and second gate spacers GS1 and GS2 decreases.

The first inner sidewall SL1_I1 of the first semiconductor layer SL1 may include a first portion P1a, which is connected to the first lower portion GS1_L1 of the first gate spacer GS1, a second portion P2a, which is connected to the second lower portion GS1_L2 of the first gate spacer GS1, and a third portion P3a, which is provided between the first and second portions P1*a* and P2*a* of the first inner sidewall SL1_I1 of the first semiconductor layer SL1. In an embodiment, when viewed in the plan view of FIG. 1G, the third portion P3*a* of the first inner sidewall SL1_I1 of the first semiconductor layer SL1 may be a center portion of the first inner sidewall SL1_I1 of the first semiconductor layer SL1 in the first direction D1.

The second inner sidewall SL1_I2 of the first semiconductor layer SL1 may include a first portion P1*b*, which is connected to the first lower portion GS2_L1 of the second gate spacer GS2, a second portion P2*b*, which is connected to the second lower portion GS2_L2 of the second gate spacer GS2, and a third portion P3*b*, which is provided between the first and second portions P1*b* and P2*b* of the second inner sidewall SL1_I2 of the first semiconductor layer SL1. In an embodiment, when viewed in the plan view of FIG. 1G, the third portion P3*b* of the second inner sidewall SL1_I2 of the first semiconductor layer SL1 may be a center portion of the second inner sidewall SL1_I2 of the first semiconductor layer SL1 in the first direction D1.

The first to third portions P1*a*, P2*a* and P3*a* of the first inner sidewall SL1 of the first semiconductor layer SL1 and the first to third portions P1*b*, P2*b* and P3*b* of the second inner sidewall SL1_I2 of the first semiconductor layer SL1 may be disposed at the same level.

A distance L1, in the second direction D2, between the first portion P1*a* of the first inner sidewall SL1_I1 of the first semiconductor layer SL1 and the first portion P1*b* of the second inner sidewall SL1_I2 of the first semiconductor layer SL1 may be smaller than a distance L2, in the second direction D2, between the third portion P3*a* of the first inner sidewall SL1_I1 of the first semiconductor layer SL1 and the third portion P3*b* of the second inner sidewall SL1_I2 of the first semiconductor layer SL1. A distance, in the second direction D2, between the second portion P2*a* of the first inner sidewall SL1_I1 of the first semiconductor layer SL1 and the second portion P2*b* of the second inner sidewall SL1_I2 of the first semiconductor layer SL1 may be smaller than the distance L2, in the second direction D2, between the third portion P3*a* of the first inner sidewall SL1_I1 of the first semiconductor layer SL1 and the third portion P3*b* of the second inner sidewall SL1_I2 of the first semiconductor layer SL1. In an embodiment, the distance, in the second direction D2, between the first and second inner sidewalls SL1_I1 and SL1_I2 of the first semiconductor layer SL1 may be maximum along an imaginary line connecting the third portion P3*a* of the first inner sidewall SL1_I1 of the first semiconductor layer SL1 to the third portion P3*b* of the second inner sidewall SL1_I2 of the first semiconductor layer SL1.

The first outer sidewall SL1_O1 of the first semiconductor layer SL1 may have a convex shape in an opposite direction of the second semiconductor layer SL2. The first inner sidewall SL1_I1 of the first semiconductor layer SL1 may also have a convex shape in the opposite direction of the second semiconductor layer SL2. For example, when viewed in the plan view of FIG. 1G, the first inner sidewall SL1_I1 of the first semiconductor layer SL1 may have a convex shape in the opposite direction of the second semiconductor layer SL2. The second outer sidewall SL1_O2 of the first semiconductor layer SL1 may have a convex shape in the opposite direction of the second semiconductor layer SL2. The second inner sidewall SL1_I2 of the first semiconductor layer SL1 may also have a convex shape in the opposite direction of the second semiconductor layer SL2. For example, when viewed in the plan view of FIG. 1G, the second inner sidewall SL1_I2 of the first semiconductor layer SL1 may have a convex shape in the opposite direction of the second semiconductor layer SL2.

According to an embodiment, a distance between the outer sidewall SL1_O1 or SL1_O2 of the first semiconductor layer SL1 and the inner sidewall SL1_I1 or SL_I2 of the first semiconductor layer SL1 adjacent thereto may be uniform, when measured at the same level in the third direction D3. For example, when viewed in the plan view of FIG. 1G, the distance, in the second direction D2, between the first outer and inner sidewalls SL1_O1 and SL1_I1 of the first semiconductor layer SL1 may be uniform. In an embodiment, when measured at the same level, the distance between the outer sidewall SL1_O1 or SL1_O2 of the first semiconductor layer SL1 and the inner sidewall SL1_I1 or SL_I2 of the first semiconductor layer SL1 adjacent thereto may decrease according as positions of two portions of the first semiconductor layer SL1 where the distance is measured become closer to the lower portion GS1_L1, GS1_L2, GS2_L1, or GS2_L2 of the gate spacer GS1 or GS2 adjacent thereto decreases. In this case, the distances, in the second direction D2, between the outer sidewall SL1_O1 or SL1_O2 of the first semiconductor layer SL1 and the inner sidewall SL1_I1 or SL_I2 of the first semiconductor layer SL1 adjacent thereto may have a difference smaller than 5 nm.

The first semiconductor layer SL1 may include contact surfaces SL1_C1 and SL1_C2. Each of the contact surfaces SL1_C1 and SL1_C2 of the first semiconductor layer SL1 may be formed on the lower portion GS1_L1, GS1_L2, GS2_L1, or GS2_L2 of the gate spacer GS1 or GS2. As an example, the first semiconductor layer SL1 may include a first contact surface SL1_C1, which is formed on the first lower portion GS1_L1 of the first gate spacer GS1, and a second contact surface SL1_C2, which is formed on the first lower portion GS2_L1 of the second gate spacer GS2.

The first contact surface SL1_C1 of the first semiconductor layer SL1 may be disposed between the first outer and inner sidewalls SL1_O1 and SL1_I1 of the first semiconductor layer SL1 to connect the first outer and inner sidewalls SL1_O1 and SL1 of the first semiconductor layer SL1 to each other. The second contact surface SL1_C2 of the first semiconductor layer SL1 may be disposed between the second outer and inner sidewalls SL1_O2 and SL1_I2 of the first semiconductor layer SL1 to connect the second outer and inner sidewalls SL1_O2 and SL1_I2 of the first semiconductor layer SL1 to each other.

A width of each of the contact surfaces SL1_C1 and SL1_C2 of the first semiconductor layer SL1 may be greater than a thickness of each of the first and second sidewall portions SL2_S1 and SL2_S2 of the second semiconductor layer SL2. As an example, when viewed in the plan view of FIG. 1G, the width of the first contact surface SL1_C1 of the first semiconductor layer SL1 in the second direction D2 may be greater than the thickness of the first sidewall portion SL2_S1 of the second semiconductor layer SL2 in the second direction D2. As an example, when viewed in the plan view of FIG. 1G, the width of the second contact surface SL1_C2 of the first semiconductor layer SL1 in the second direction D2 may be greater than the thickness of the second sidewall portion SL2_S2 of the second semiconductor layer SL2 in the second direction D2.

In an embodiment, when measured at the same level, a thickness of each of the first and second sidewall portions SL1_S1 and SL1_S2 of the first semiconductor layer SL1 may be uniform. For example, when viewed in the plan view of FIG. 1G, the thickness of each of the first and second sidewall portions SL1_S1 and SL1_S2 of the first semiconductor layer SL1 in the second direction D2 may be uniform. In an embodiment, when measured at the same level, the thickness of each of the first and second sidewall portions SL1_S1 and SL1_S2 of the first semiconductor layer SL1 may decrease according as positions of two portions of the first semiconductor layer SL1 where the thickness is measured become closer to the lower portion GS1_L1, GS1_L2, GS2_L1, or GS2_L2 of the gate spacer GS1 or GS2 adjacent thereto decreases.

The thickness of the lower portion SL2_L of the second semiconductor layer SL2 may be greater than a thickness of the first and second sidewall portions SL2_S1 and SL2_S2 of the second semiconductor layer SL2. As an example, the thickness of the lower portion SL2_L of the second semiconductor layer SL2 in the third direction D3 may be greater than the thickness of each of the first and second sidewall portions SL2_S1 and SL2_S2 of the second semiconductor layer SL2 in the second direction D2. In an embodiment, the thickness of the lower portion SL2_L of the second semiconductor layer SL2 may be greater than the thickness of the first and second sidewall portions SL2_S1 and SL2_S2 of the second semiconductor layer SL2 by a thickness less than 5 nm. The thickness of the first and second sidewall portions SL2_S1 and SL2_S2 of the second semiconductor layer SL2 may decrease in an upward direction (i.e., as a level increases).

The second semiconductor layer SL2 may include a first outer sidewall SL2_O1, a second outer sidewall SL2_O2, a first inner sidewall SL2_I1, and a second inner sidewall SL2_I2. Each of the first and second outer sidewalls SL2_O1 and SL2_O2 of the second semiconductor layer SL2 may be formed on the first semiconductor layer SL1. Each of the first and second inner sidewalls SL2_I1 and SL2_I2 of the second semiconductor layer SL2 may be formed on the third semiconductor layer SL3.

The first outer and inner sidewalls SL2_O1 and SL2_I1 of the second semiconductor layer SL2 may be formed on the first and second lower portions GS1_L1 and GS1_L2 of the first gate spacer GS1. The second outer and inner sidewalls SL2_O2 and SL2_I2 of the second semiconductor layer SL2 may be formed on the first and second lower portions GS2_L1 and GS2_L2 of the second gate spacer GS2.

A distance between the first and second outer sidewalls SL2_O1 and SL2_O2 of the second semiconductor layer SL2 may be greater than a distance between the first and second inner sidewalls SL2_I1 and SL2_I2 of the second semiconductor layer SL2.

The first outer sidewall SL2_O1 of the second semiconductor layer SL2 may be formed on the first inner sidewall SL1_I1 of the first semiconductor layer SL1. The second outer sidewall SL2_O2 of the second semiconductor layer SL2 may be formed on the second inner sidewall SL1_I2 of the first semiconductor layer SL1.

A distance between the first and second outer sidewalls SL2_O1 and SL2_O2 of the second semiconductor layer SL2 may decrease according as positions of two portions of the second semiconductor layer SL2 where the distance is measured become closer to the lower portion GS1_L1, GS1_L2, GS2_L1, or GS2_L2 of the gate spacer GS1 or GS2 adjacent thereto decreases. For example, when viewed in the plan view of FIG. 1G, a distance, in the second direction D2, between portions of the first and second outer sidewalls SL2_O1 and SL2_O2 of the second semiconductor layer SL2, which are adjacent to the first lower portions GS1_L1 and GS2_L1 of the first and second gate spacers GS1 and GS2, may decrease according as positions of the two portions of the second semiconductor layer SL2 where the distance is measured become closer to the first lower portions GS1_L1 and GS2_L1 of the first and second gate spacers GS1 and GS2 decreases.

A distance between the first and second inner sidewalls SL2_I1 and SL2_I2 of the second semiconductor layer SL2 may decrease and then increase according as positions of two portions of the second semiconductor layer SL2 where the distance is measured become closer to the lower portion GS1_L1, GS1_L2, GS2_L1, or GS2_L2 of the gate spacer GS1 or GS2 adjacent thereto decreases. For example, when viewed in the plan view of FIG. 1G, a distance, in the second direction D2, between portions of the first and second inner sidewalls SL2_I1 and SL2_I2 of the second semiconductor layer SL2, which are adjacent to the first lower portions GS1_L1 and GS2_L1 of the first and second gate spacers GS1 and GS2, may decrease and then increase according as positions of the two portions of the second semiconductor layer SL2 where the distance is measured become closer to the first lower portions GS1_L1 and GS2_L1 of the first and second gate spacers GS1 and GS2 decreases.

The first outer sidewall SL2_O1 of the second semiconductor layer SL2 may have a convex shape corresponding to the first inner sidewall SL1_I1 of the first semiconductor layer SL1. For example, when viewed in the plan view of FIG. 1G, the first outer sidewall SL2_O1 of the second semiconductor layer SL2 may have a convex shape. The second outer sidewall SL2_O2 of the second semiconductor layer SL2 may have a convex shape corresponding to the second inner sidewall SL1_I2 of the first semiconductor layer SL1. For example, when viewed in the plan view of FIG. 1G, the second outer sidewall SL2_O2 of the second semiconductor layer SL2 may have a convex shape.

The first inner sidewall SL2_I1 of the second semiconductor layer SL2 may include at least two portions that are formed to have a convex shape and a concave shape, respectively. For example, when viewed in the plan view of FIG. 1G, the first inner sidewall SL2_I1 of the second semiconductor layer SL2 may include a first portion IP1*a* having a concave shape and a second portions IP2*a* having a convex shape in an opposite direction of the first semiconductor layer SL1. The first portion IP1*a* of the first inner sidewall SL2_I1 of the second semiconductor layer SL2 may be disposed between the second portions IP2*a* of the first inner sidewall SL2_I1 of the second semiconductor layer SL2. Each of the second portions IP2*a* of the first inner sidewall SL2_I1 of the second semiconductor layer SL2 may be formed on the first or second lower portion GS1_L1 or GS1_L2 of the first gate spacer GS1.

The second inner sidewall SL2_I2 of the second semiconductor layer SL2 may include at least two portions that are formed to have a convex shape and a concave shape, respectively. For example, when viewed in the plan view of FIG. 1G, the second inner sidewall SL2_I2 of the second semiconductor layer SL2 may include a first portion IP1*b* having a concave shape and a second portions IP2*b* having a convex shape in the opposite direction of the first semiconductor layer SL1. The first portion IP1*b* of the second inner sidewall SL2_I2 of the second semiconductor layer SL2 may be disposed between the second portions IP2*b* of the second inner sidewall SL2_I2 of the second semiconductor layer SL2. Each of the second portions IP2*b* of the second inner sidewall SL2_I2 of the second semiconductor layer SL2 may be formed on the first or second lower portion GS2_L1 or GS2_L2 of the second gate spacer GS2.

In a semiconductor device according to an embodiment, portions of the first semiconductor layer SL1 disposed at the same level may have a relatively uniform thickness. Thus, the first semiconductor layer SL1 may not have a portion having a relatively small thickness. In particular, the first semiconductor layer SL1 may have a sufficient large thickness near the lower portion of the gate spacer. Accordingly, it may be possible to prevent or suppress an electric field from being concentrated on a thin portion of the first semiconductor layer SL1 and to prevent or suppress a leakage current from being formed between the source/drain pattern and the gate electrode.

According to an embodiment, a source/drain region being formed of first to third semiconductor layers SL1 to SL3 and the first semiconductor layer SL1 having the uniform thickness at the same level in the third direction D3 may apply to only the first active region AR1 for forming one or more NMOSs among the first active region AR1 and the second active region AR2 for forming one or more PMOSs in the semiconductor device shown in FIG. 1A. This is because the NMOS and the PMOS may have different short channel effects or characteristics due to different impurities or dopants included in their source/drain regions.

Figure 2A:
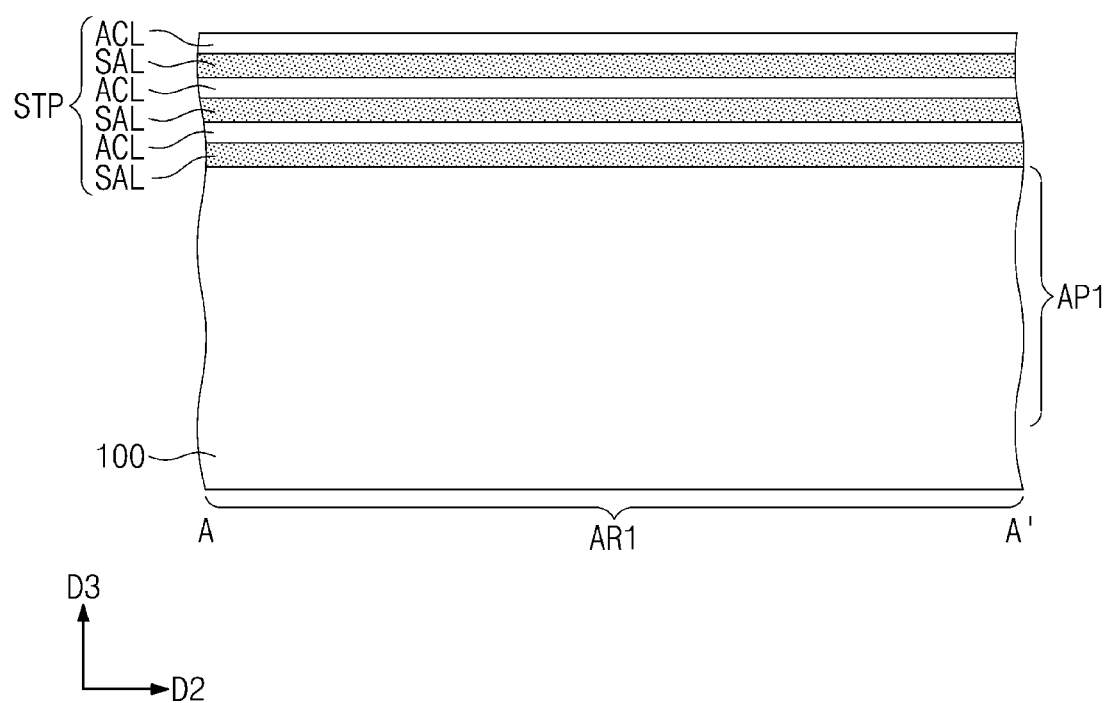
FIGS. 2A, 2B, 3A, 3B, 4A, 4B, 4C, 5A, 5B and 5C are sectional views illustrating a method of fabricating a semiconductor device, according to an embodiment.
Figure 2B:
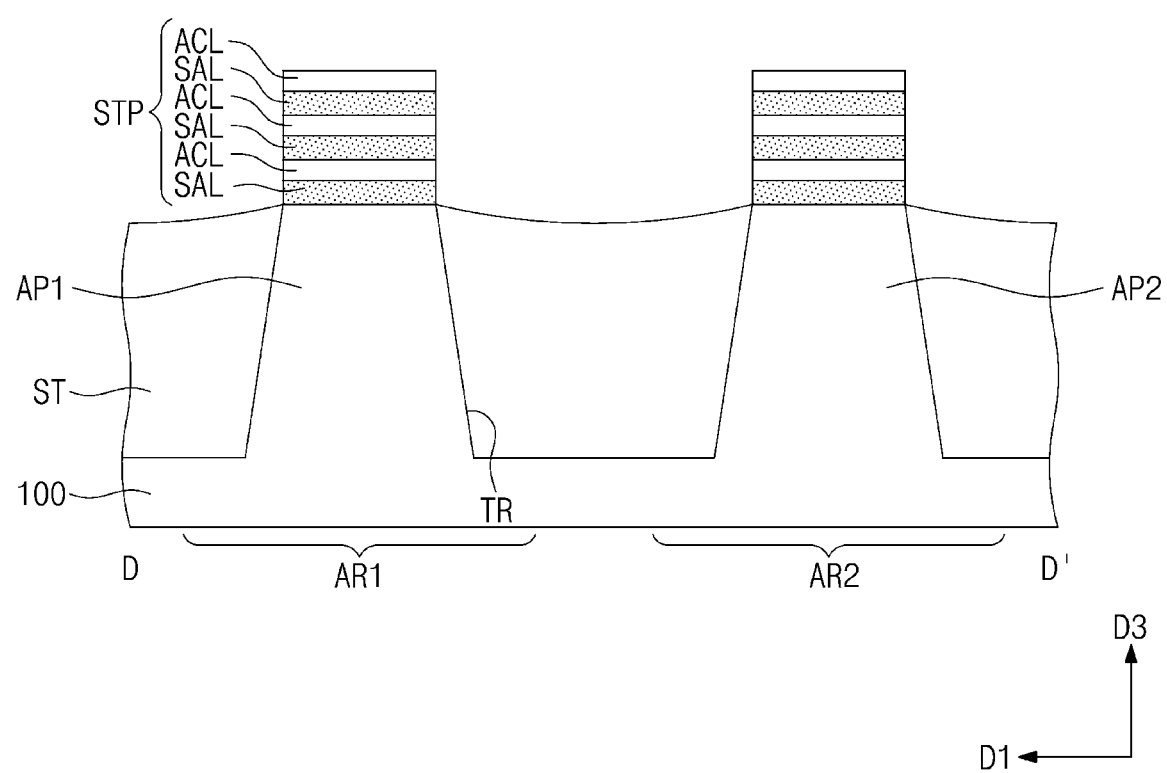
Figure 3A:
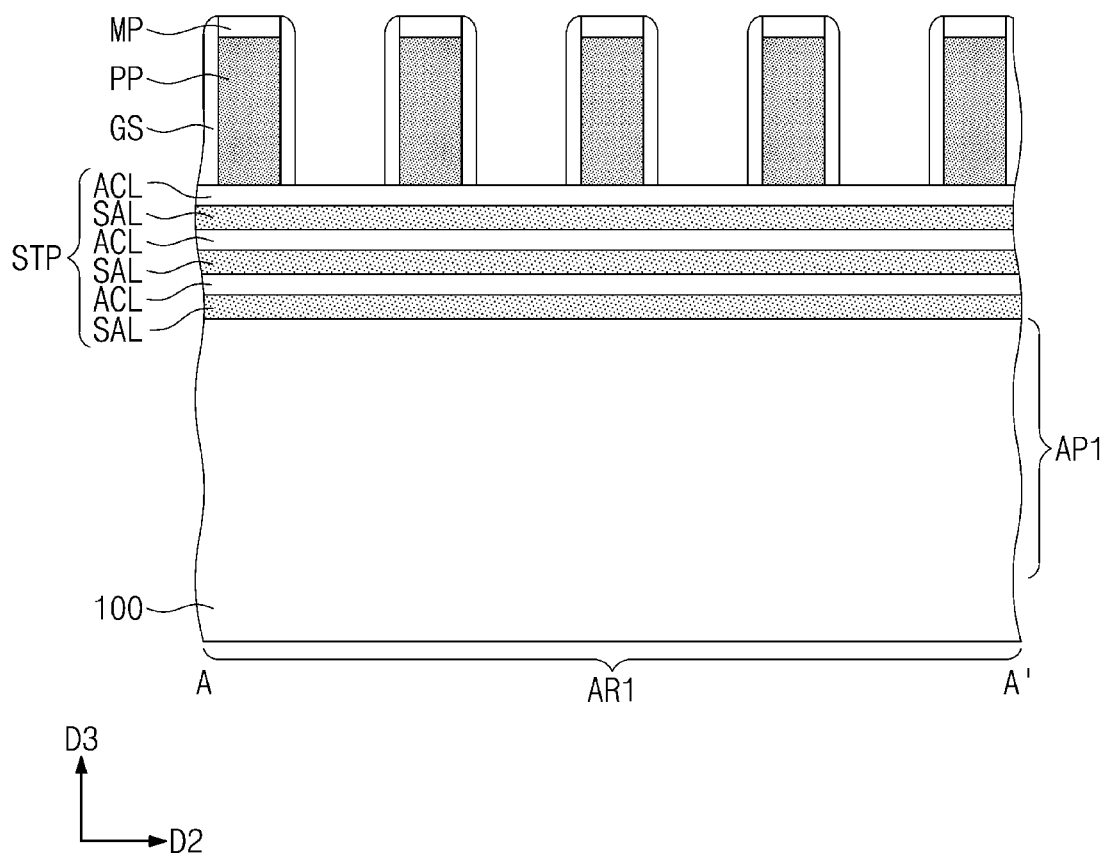
Figure 3B:
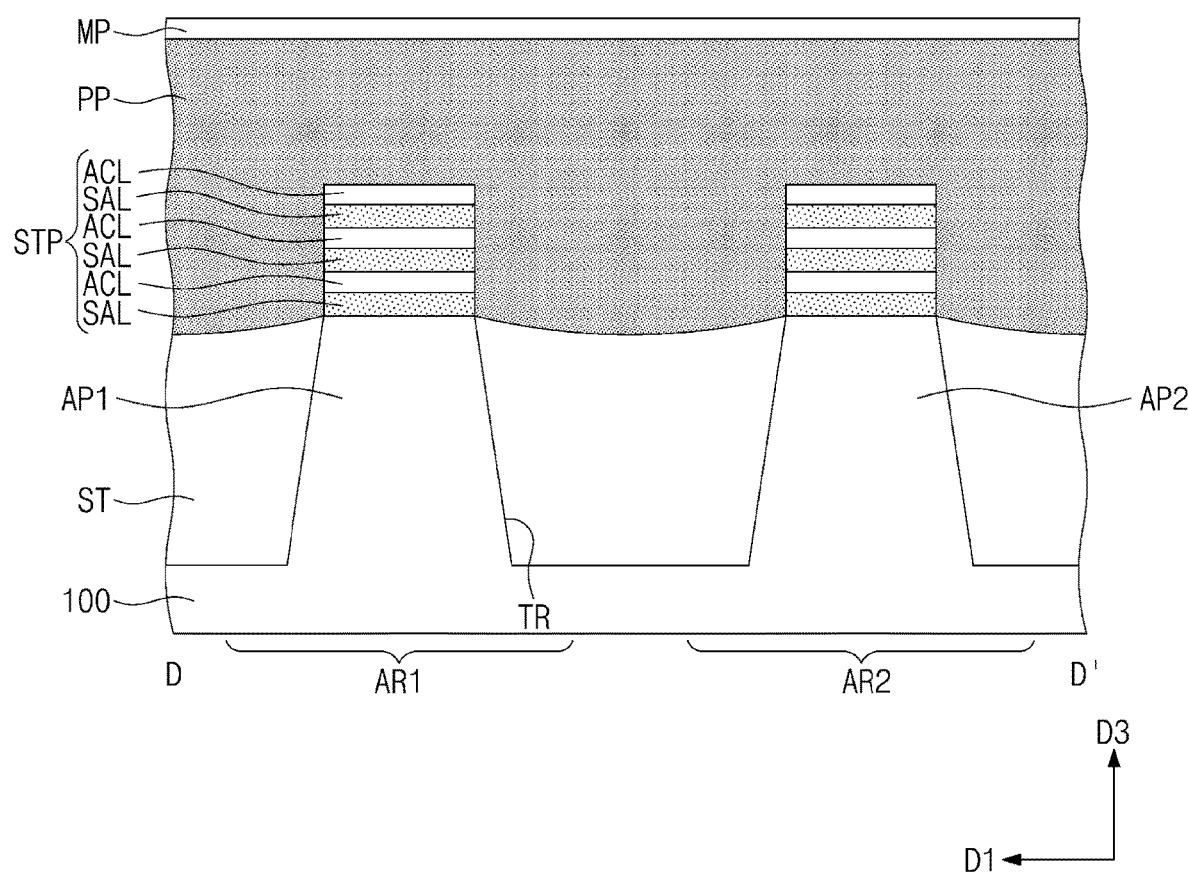
Figure 4A:
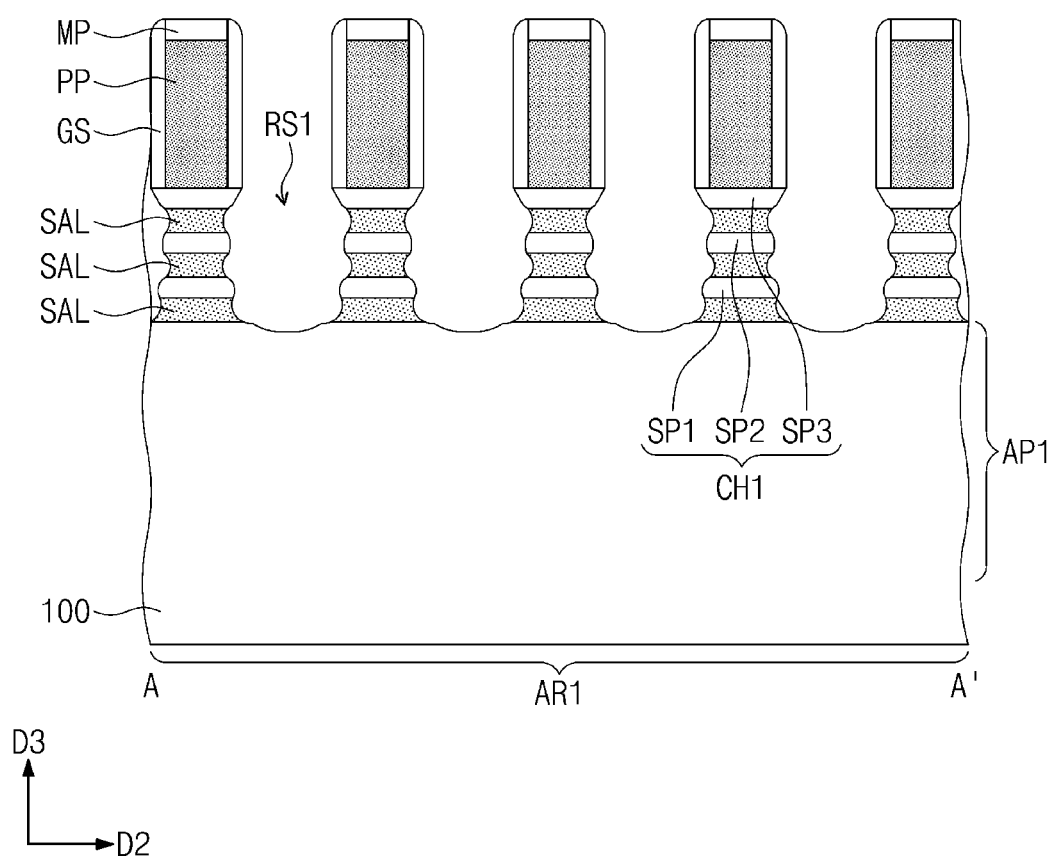
Figure 4B:
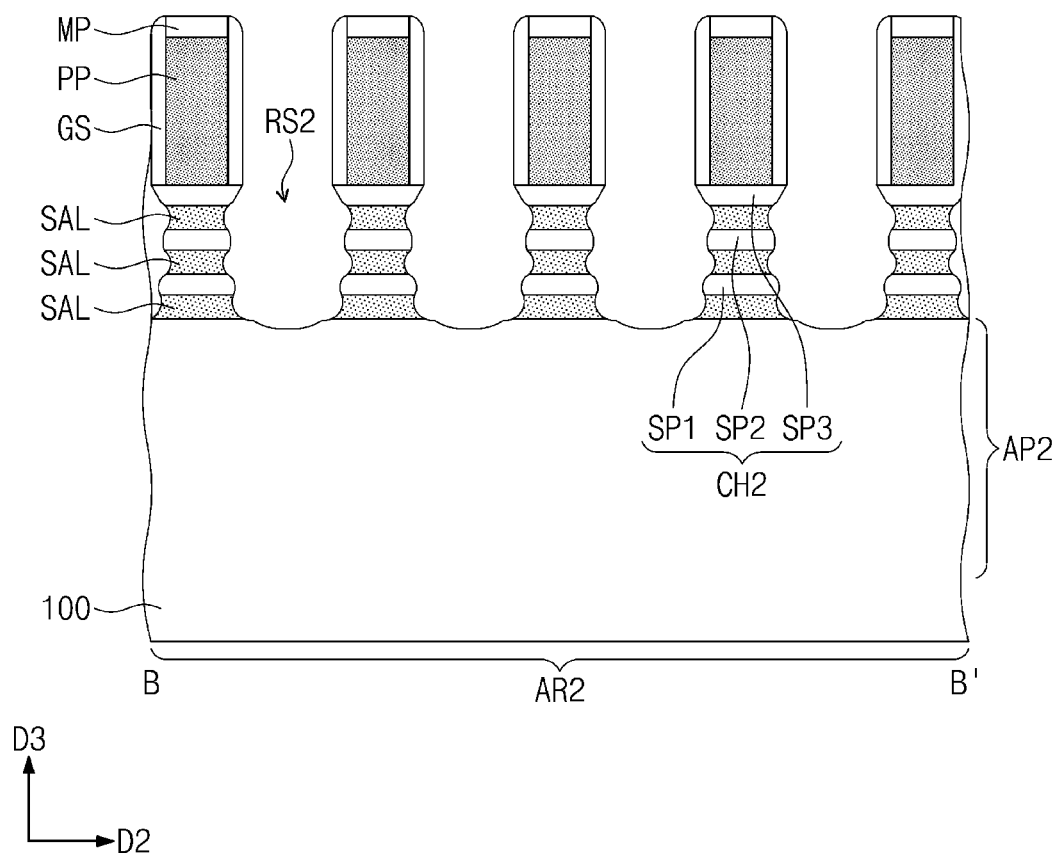
Figure 4C:
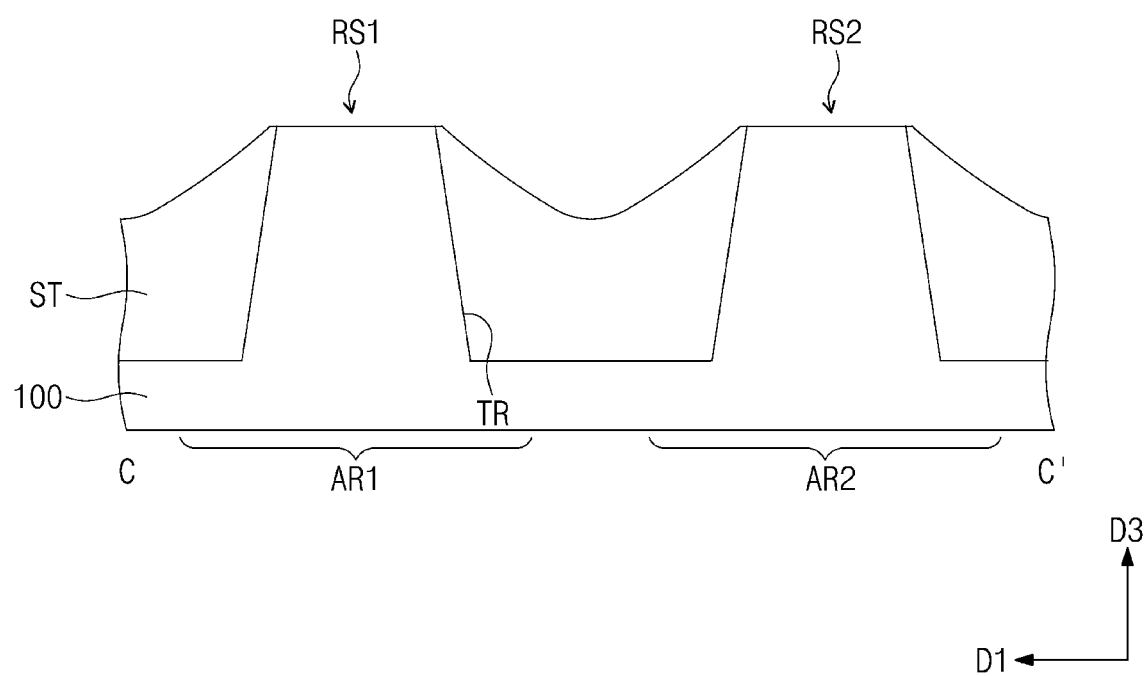
Figure 5A:
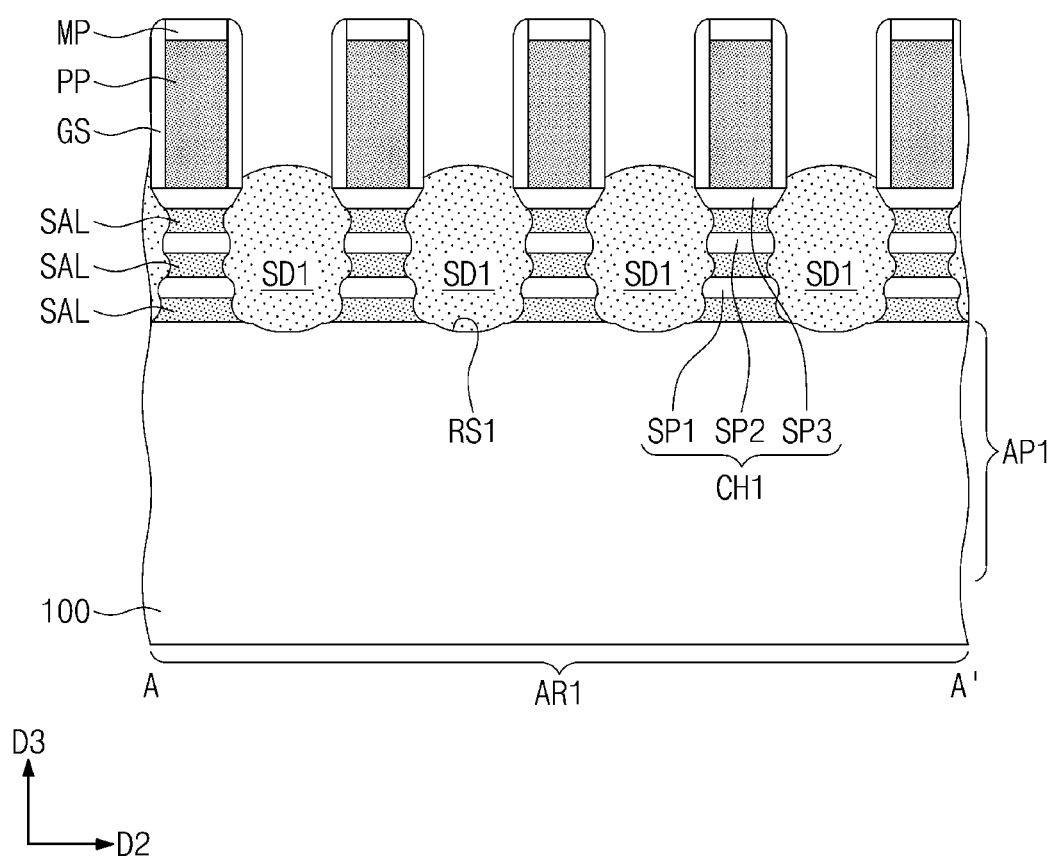
Figure 5B:
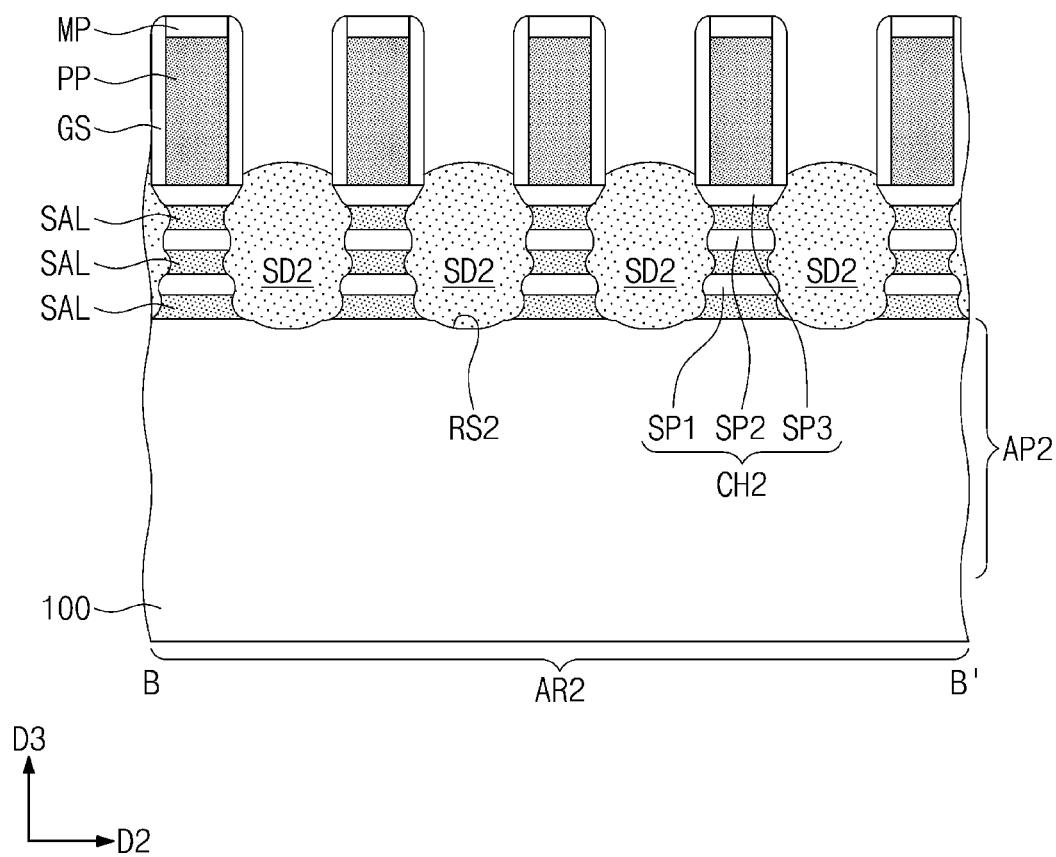
Figure 5C:
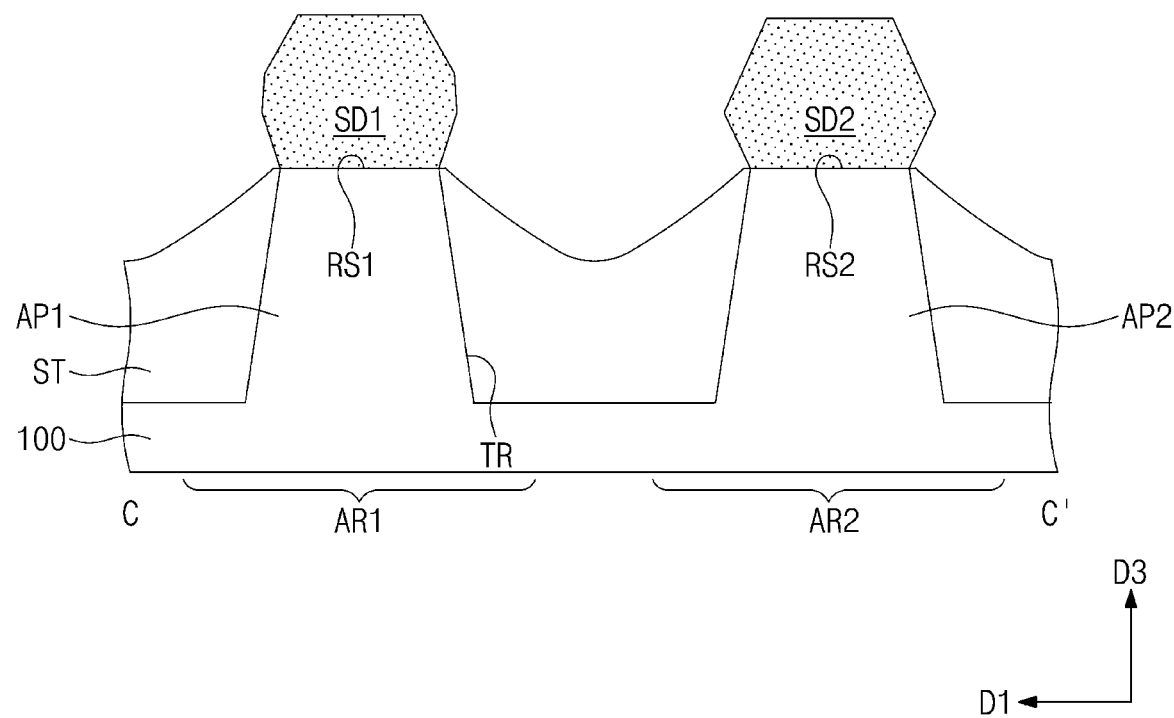

FIGS. 2A, 2B, 3A, 3B, 4A, 4B, 4C, 5A, 5B and 5C are sectional views illustrating a method of fabricating a semiconductor device, according to an embodiment. FIGS. 2A, 3A, 4A and 5A are sectional views corresponding to the line A-A' of FIG. 1A. FIGS. 2B and 3B are sectional views corresponding to the line D-D' of FIG. 1A. FIGS. 4B and 5B are sectional views corresponding to the line B-B' of FIG. 1A. FIGS. 4C and 5C are sectional views corresponding to the line C-C' of FIG. 1A.

Referring to FIGS. 2A and 2B, the substrate 100 including the first and second active regions AR1 and AR2 may be provided. Active layers ACL and sacrificial layers SAL, which are alternately stacked, may be formed on the substrate 100.

The sacrificial layer SAL may be formed of or include a material having an etch selectivity with respect to the active layer ACL. In an embodiment, the active layers ACL may be formed of or include silicon (Si), and the sacrificial layers SAL may be formed of or include silicon-germanium (SiGe). In this case, a germanium concentration of each of the sacrificial layers SAL may range from 10% to 30%. In an embodiment, the active layers ACL may be formed of or include silicon-germanium (SiGe), and the sacrificial layers SAL may be formed of or include silicon (Si).

Mask patterns may be respectively formed on the first and second active regions AR1 and AR2 of the substrate 100. The mask pattern may be a line- or bar-shaped pattern that is extended in the second direction D2.

A patterning process using the mask patterns as an etch mask may be performed to form the trench TR defining the first and second active patterns AP1 and AP2. The first active pattern AP1 may be formed on the first active region AR1. The second active pattern AP2 may be formed on the second active region AR2.

A stacking pattern STP may be formed on each of the first and second active patterns AP1 and AP2. The stacking pattern STP may include the active layers ACL and the sacrificial layers SAL, which are alternately stacked. The stacking pattern STP may be formed along with the first and second active patterns AP1 and AP2, during the patterning process.

The device isolation layer ST may be formed to fill the trench TR. The formation of the device isolation layer ST may include forming an insulating layer on the first and second active patterns AP1 and AP2 and the stacking patterns STP, and recessing the insulating layer to expose the stacking patterns STP. The stacking patterns STP may be placed above the device isolation layer ST and may be upwardly exposed to the outside of the device isolation layer ST. In other words, the stacking patterns STP may protrude above the device isolation layer ST.

Referring to FIGS. 3A and 3B, sacrificial patterns PP may be formed to cross the stacking patterns STP. Each of the sacrificial patterns PP may be a line- or bar-shaped pattern that is extended in the first direction D1. The sacrificial patterns PP may be arranged at a first pitch in the second direction D2.

The formation of the sacrificial patterns PP may include forming a sacrificial layer on the stacking patterns STP, forming hard mask patterns MP on the sacrificial layer, and patterning the sacrificial layer using the hard mask patterns MP as an etch mask. In an embodiment, the sacrificial patterns PP may be formed of or include polysilicon.

A pair of gate spacers GS may be formed on opposite side surfaces of the sacrificial pattern PP. The formation of the gate spacers GS may include conformally forming a gate spacer layer on the sacrificial patterns PP and anisotropically etching the gate spacer layer.

Referring to FIGS. 4A, 4B and 4C, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2.

The first recesses RS1 may be formed by etching the stacking pattern STP on the first active pattern AP1 using the hard mask patterns MP and the gate spacers GS as an etch mask. The first recess RS1 may be provided between adjacent ones of the sacrificial patterns PP. The second recesses RS2 may be formed by etching the stacking pattern STP on the second active pattern AP2 using the hard mask patterns MP and the gate spacers GS as an etch mask. The second recess RS2 may be provided between adjacent ones of the sacrificial patterns PP. In an embodiment, the first recesses RS1 and the second recesses RS2 may be formed by separate processes.

As a result of the formation of the first recesses RS1, the active layers ACL may be cut to form the first to third semiconductor patterns SP1, SP2 and SP3 of the first channel pattern CH1. As a result of the formation of the second recesses RS2, the active layers ACL may be cut to form the first to third semiconductor patterns SP1, SP2 and SP3 of the second channel pattern CH2.

In the process of forming the first and second recesses RS1 and RS2, an etch rate of the sacrificial layers SAL may be higher than an etch rate of the active layers ACL. Accordingly, widths of the sacrificial layers SAL between the first recesses RS1 may be smaller than widths of the first to third semiconductor patterns SP1, SP2 and SP3 between the first recesses RS1, and widths of the sacrificial layers SAL between the second recesses RS2 may be smaller than widths of the first to third semiconductor patterns SP1, SP2 and SP3 between the second recesses RS2. In an embodiment, after the formation of the first and second recesses RS1 and RS2, an indent process of selectively etching the sacrificial layers SAL may be further performed to reduce the widths of the sacrificial layers SAL.

Referring to FIGS. 5A, 5B and 5C, the first source/drain patterns SD1 may be formed in the first recesses RS1, respectively. The first source/drain pattern SD1 may be formed by an epitaxial growth process. As an example, the epitaxial growth process may include a chemical vapor deposition (CVD) process or a molecular beam epitaxy (MBE) process.

The second source/drain patterns SD2 may be formed in the second recesses RS2. The second source/drain pattern SD2 may be formed by an epitaxial growth process. In an embodiment, the formation of the second source/drain pattern SD2 may include forming a low concentration semiconductor layer and forming a high concentration semiconductor layer after the forming of the low concentration semiconductor layer. Impurities may be injected into the low and high concentration semiconductor layers such that the high concentration semiconductor layer has an impurity concentration higher than that of the low concentration semiconductor layer.

In an embodiment, during the formation of the low concentration semiconductor layer, the low concentration semiconductor layer may be doped with impurities (e.g., B, Ga, or In) in an in-situ manner to have a p-type conductivity. In an embodiment, the impurities may be injected into the low concentration semiconductor layer to form a p-type low concentration semiconductor layer, after the formation of the low concentration semiconductor layer.

In an embodiment, during the formation of the high concentration semiconductor layer, the high concentration semiconductor layer may be doped with impurities (e.g., B, Ga, or In) in an in-situ manner to have a p-type conductivity. In an embodiment, the impurities may be injected into the high concentration semiconductor layer to form a p-type high concentration semiconductor layer, after the formation of the high concentration semiconductor layer.

Referring to FIGS. 1A, 1B, 1C, 1D and 1E, the first interlayer insulating layer 110 may be formed on the first and second source/drain patterns SD1 and SD2, the hard mask patterns MP, and the gate spacers GS.

The first interlayer insulating layer 110 may be planarized to expose top surfaces of the sacrificial patterns PP. In an embodiment, the planarization of the first interlayer insulating layer 110 may be performed using an etch-back process or a chemical mechanical polishing (CMP) process. As a result of the planarization process, all of the hard mask patterns MP may be removed.

The exposed sacrificial patterns PP may be selectively removed. Since the sacrificial patterns PP are removed, the first and second channel patterns CH1 and CH2 and the sacrificial layers SAL may be exposed to the outside. In an embodiment, the removal of the sacrificial patterns PP may include performing a wet etching process using etching solution capable of selectively etching polysilicon.

The exposed sacrificial layers SAL may be selectively removed. For example, an etching process may be performed to selectively etch only the sacrificial layers SAL and to leave the first to third semiconductor patterns SP1, SP2 and SP3. In an embodiment, the sacrificial layers SAL may be formed of or include silicon-germanium, and in this case, the sacrificial layers SAL may be selectively removed by an etching process capable of selectively etching the silicon-germanium layer.

The gate insulating layer GI may be formed on exposed surfaces of the first to third semiconductor patterns SP1, SP2 and SP3. The gate electrode GE may be formed on the gate insulating layer GI. The gate capping pattern GP may be formed on the gate electrode GE.

The second interlayer insulating layer 120 may be formed on the first interlayer insulating layer 110. The active contacts AC may be formed to penetrate the second interlayer insulating layer 120 and the first interlayer insulating layer 110 and to be electrically connected to the first and second source/drain patterns SD1 and SD2, respectively. The formation of the active contact AC may include forming the barrier pattern BM and forming the conductive pattern FM on the barrier pattern BM. The division structures DB may be formed to penetrate the first and second interlayer insulating layers 110 and 120 and to be extended into the first and second active patterns AP1 and AP2.

The third interlayer insulating layer 130 may be formed on the active contacts AC and the second interlayer insulating layer 120. The first conductive structures 131 may be formed in the third interlayer insulating layer 130. The fourth interlayer insulating layer 140 may be formed on the third interlayer insulating layer 130. The second conductive structures 141 may be formed in the fourth interlayer insulating layer 140.

FIGS. 6A, 6B, 7A, 7B, 8A, 8B, 9A and 9B are diagrams illustrating a method of fabricating a first source/drain pattern according to an embodiment.

Figure 6A:
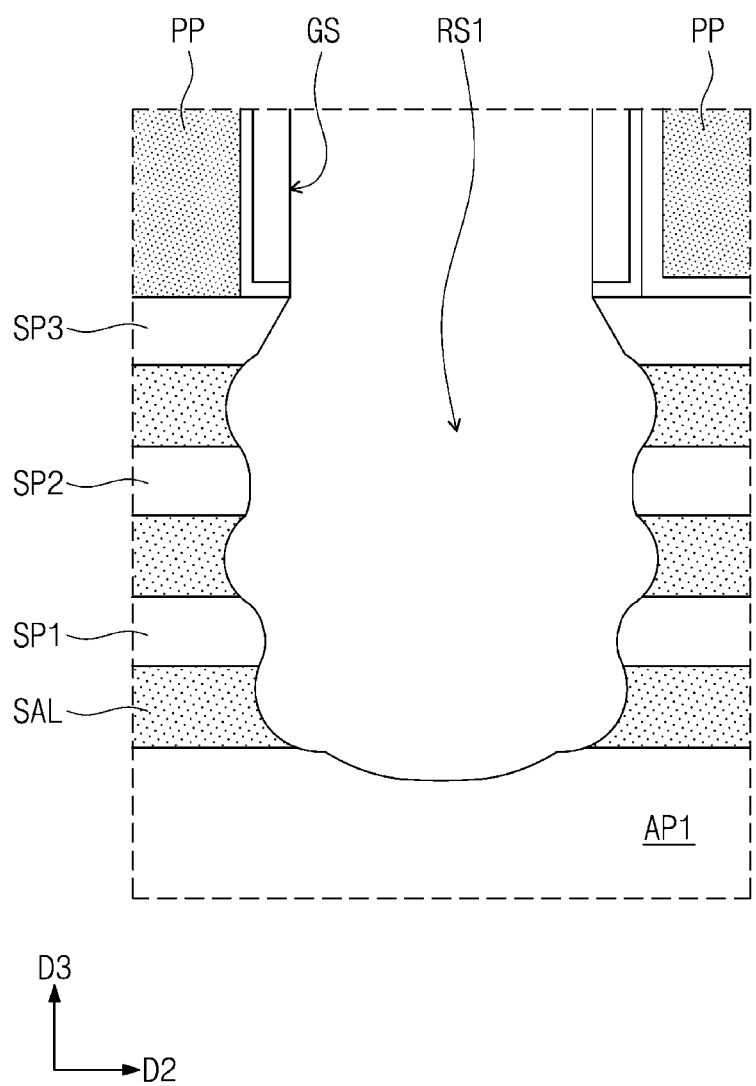
FIGS. 6A, 6B, 7A, 7B, 8A, 8B, 9A and 9B are diagrams illustrating a method of fabricating a first source/drain pattern according to an embodiment.
Figure 6B:
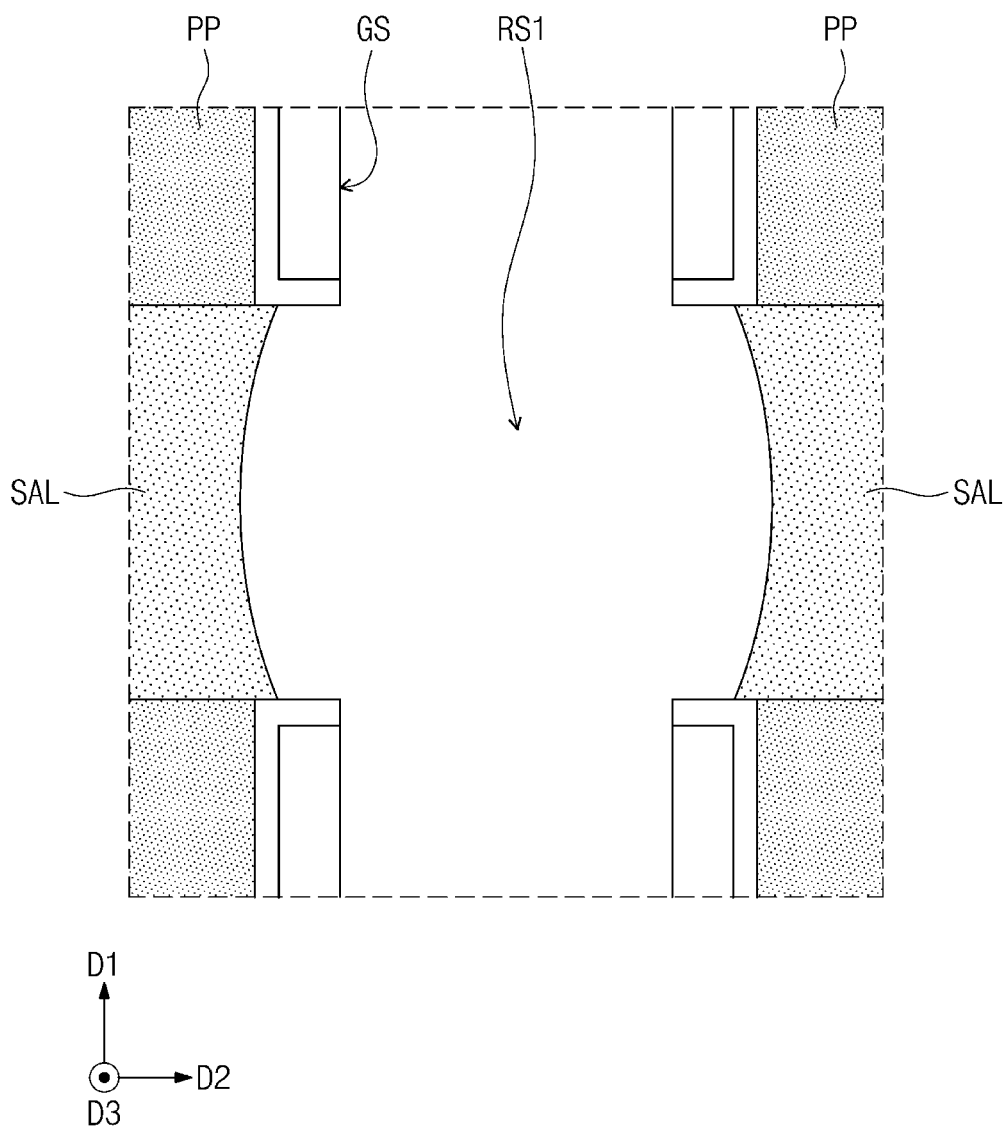

Referring to FIGS. 6A and 6B, the first active pattern AP1, the sacrificial layers SAL, the first to third semiconductor patterns SP1, SP2 and SP3, the sacrificial patterns PP, the gate spacers GS, and the first recess RS1 may be formed in a similar manner to those in FIGS. 2A, 2B, 3A, 3B, 4A, 4B and 4C.

Figure 7A:
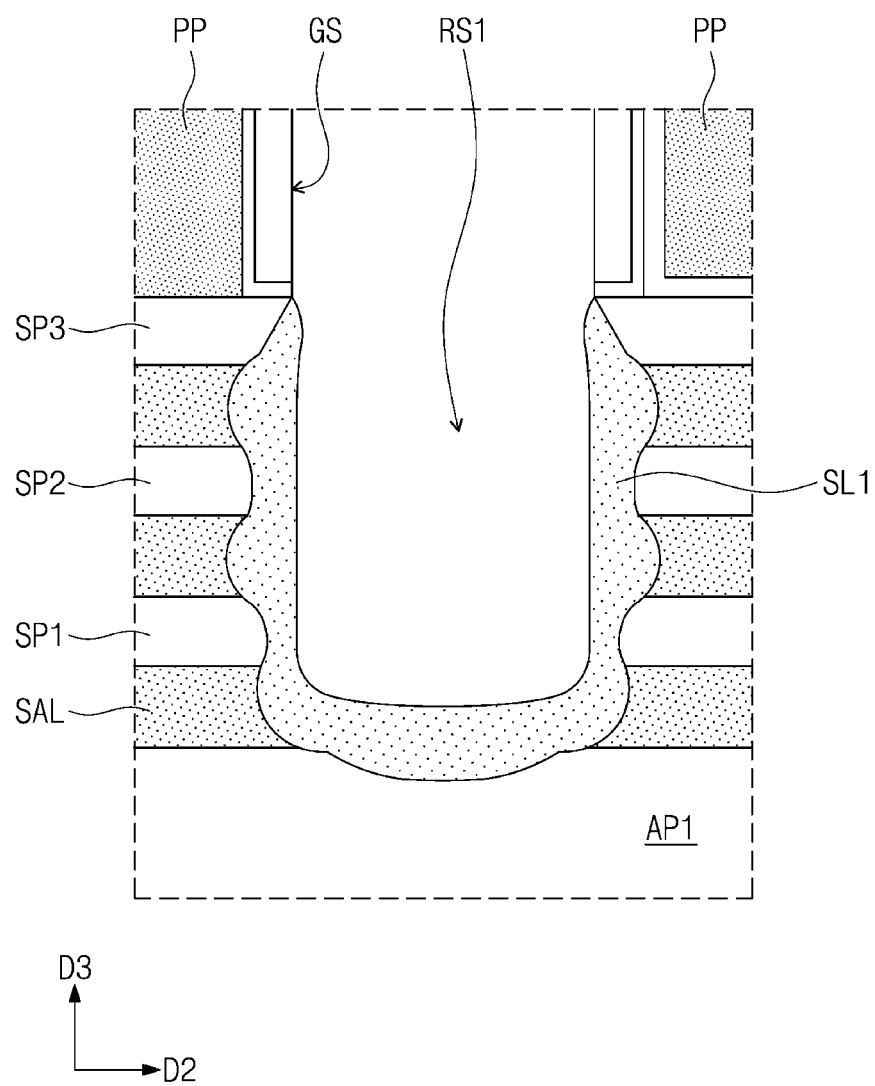
Figure 7B:
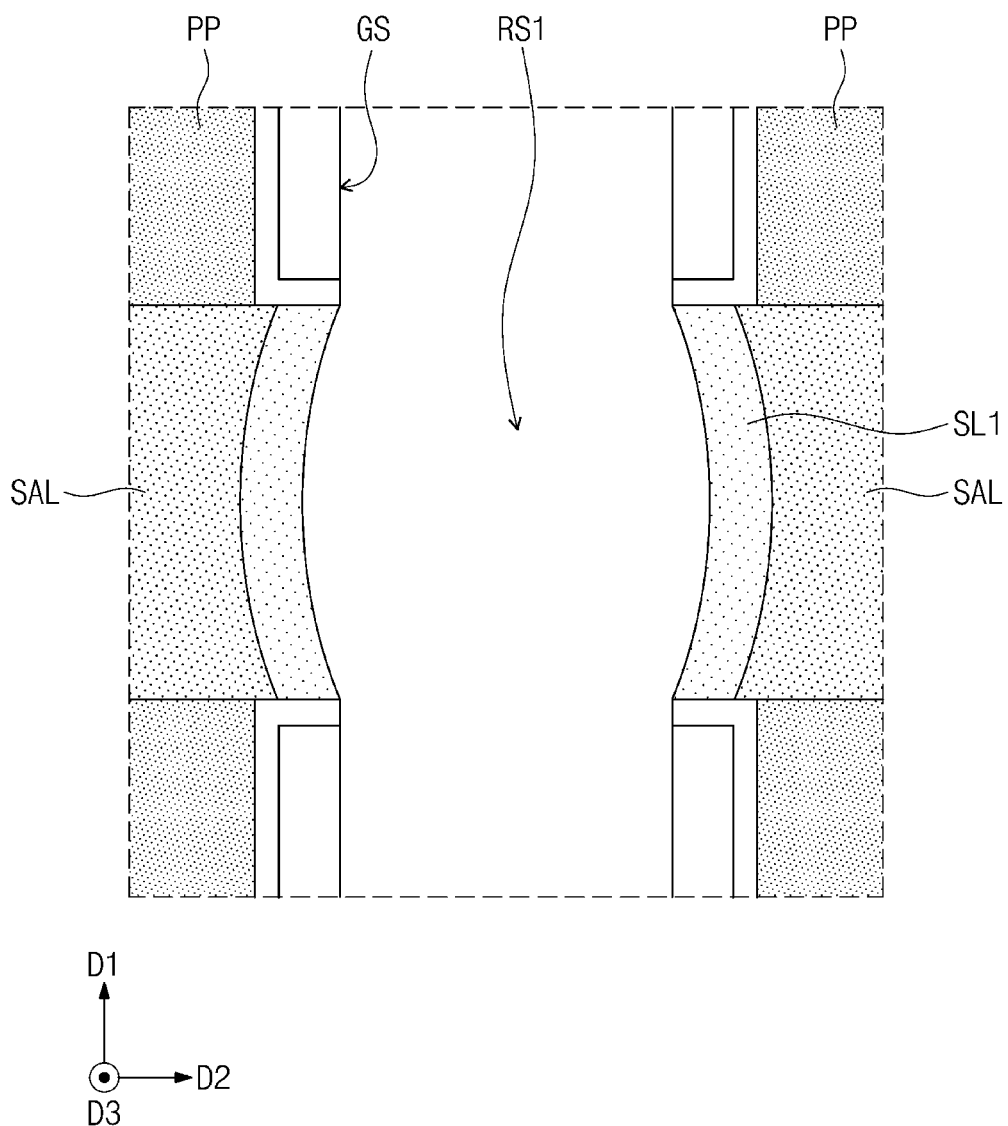

Referring to FIGS. 7A and 7B, the first semiconductor layer SL1 may be formed. The first semiconductor layer SL1 may be formed on the sacrificial layers SAL and the first to third semiconductor patterns SP1, SP2 and SP3, which are exposed by the first recess RS1. The first semiconductor layer SL1 may be formed by a first process. In an embodiment, the first process may be a CVD process. The first process may be an epitaxial growth process.

Figure 8A:
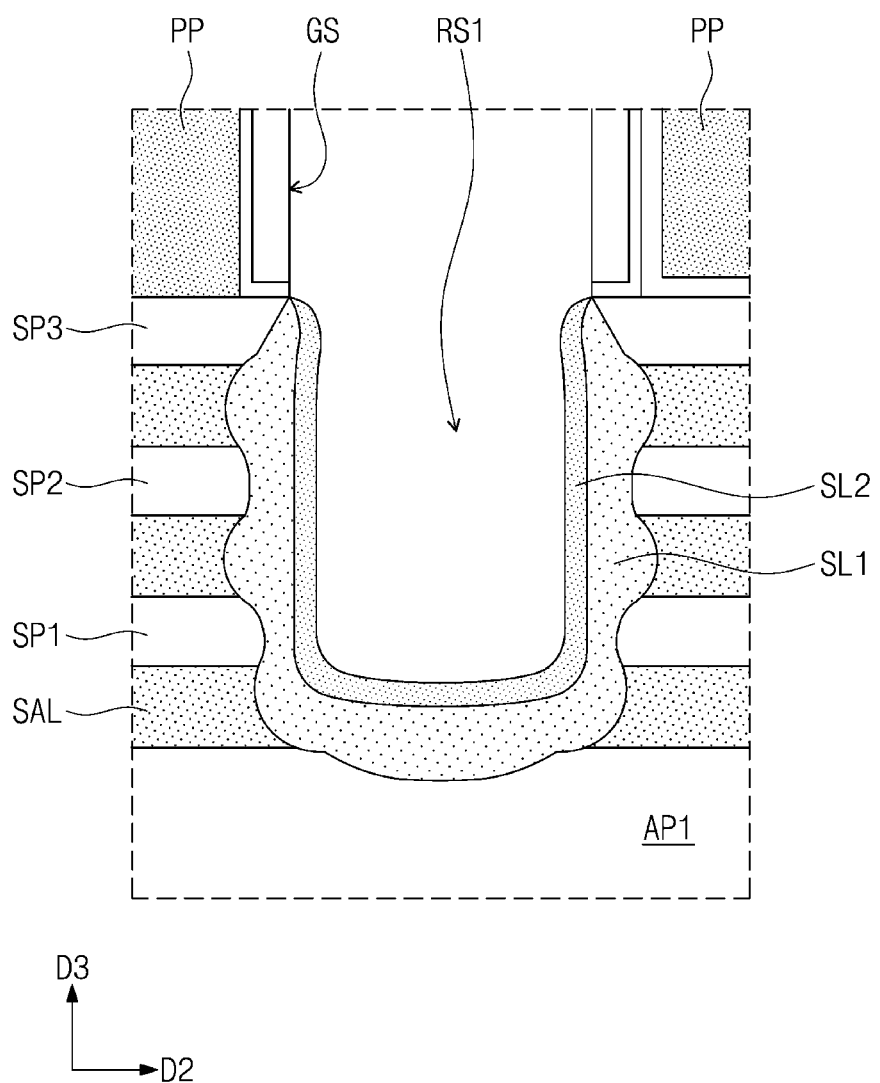
Figure 8B:
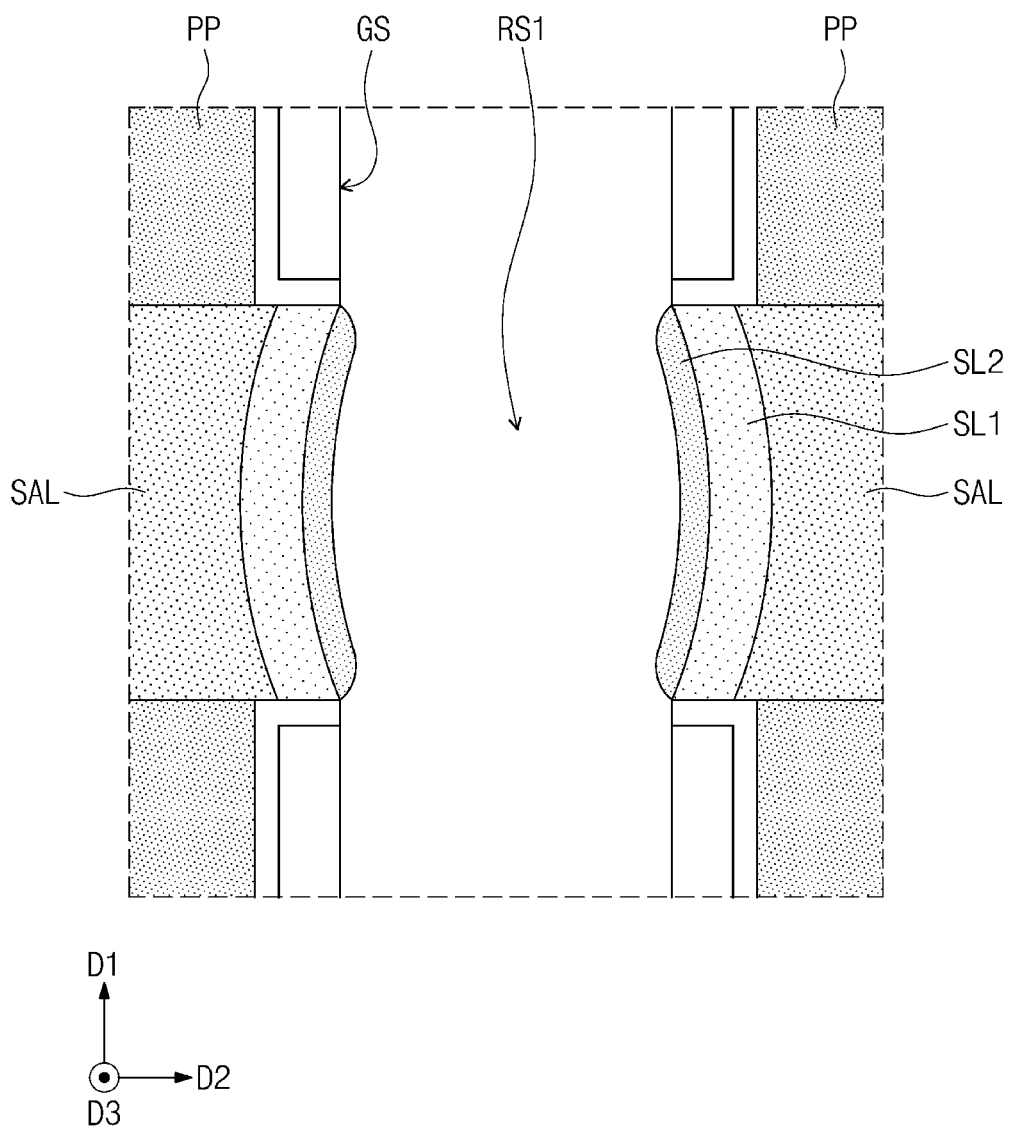

Referring to FIGS. 8A and 8B, the second semiconductor layer SL2 may be formed on the first semiconductor layer SL1. The second semiconductor layer SL2 may be formed by a second process. The second process may be an epitaxial growth process. In an embodiment, the second process may be a CVD process.

In an embodiment, during the formation of the second semiconductor layer SL2, the second semiconductor layer SL2 may be doped with impurities (e.g., As, P, or Sb) in an in-situ manner to form the second semiconductor layer SL2 with an n-type conductivity. In an embodiment, the impurities may be injected into the second semiconductor layer SL2 to form the second semiconductor layer SL2 with the n-type conductivity, after the formation of the second semiconductor layer SL2.

Figure 9A:
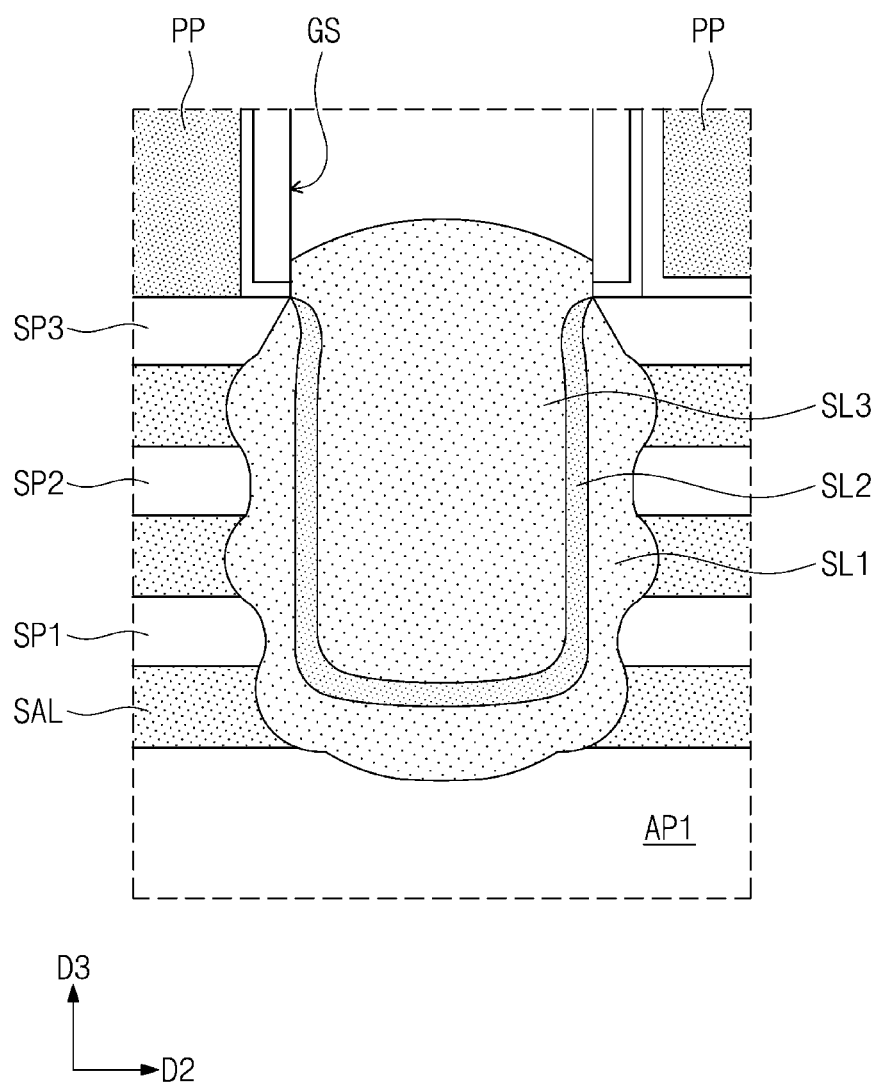
Figure 9B:
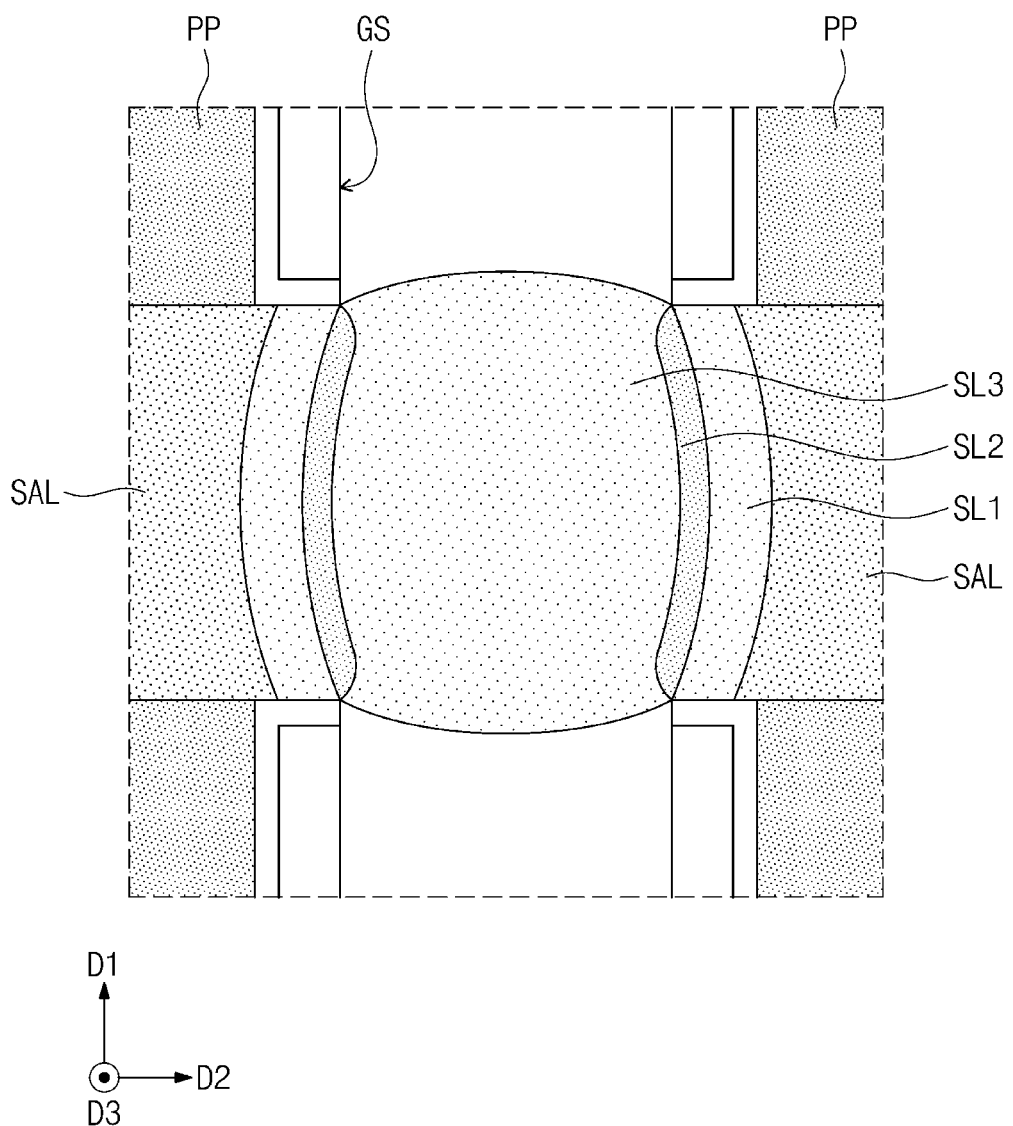

Referring to FIGS. 9A and 9B, the third semiconductor layer SL3 may be formed on the second semiconductor layer SL2. The third semiconductor layer SL3 may be formed by a third process. The third process may be an epitaxial growth process. In an embodiment, the third process may be a CVD process.

In an embodiment, during the formation of the third semiconductor layer SL3, the third semiconductor layer SL3 may be doped with impurities (e.g., P) in an in-situ manner to form the third semiconductor layer SL3 with an n-type conductivity. In an embodiment, the impurities may be injected into the third semiconductor layer SL3 to form the third semiconductor layer SL3 of the n-type conductivity, after the formation of the third semiconductor layer SL3.

A process temperature of the first process may be lower than a process temperature of the second process and a process temperature of the third process. As an example, the process temperature of the first process may range from 500° C. to 650° C. A process pressure of the first process may be higher than a process pressure of the second process. As an example, a process pressure of the first process may be higher than or equal to 500 torr.

In a method of fabricating a semiconductor device according to an embodiment, the first semiconductor layer SL1 may be formed by a process that is performed at a relatively low temperature and a relatively high pressure. Accordingly, the first semiconductor layer SL1 may be formed to have a relatively conformal thickness.

In a semiconductor device according to an embodiment, since the inner spacer is not formed between the source/drain pattern and the gate electrode other than the gate dielectric layer, it may be possible to reduce a difficulty in a process of fabricating the semiconductor device and cost for the fabrication process.

According to an embodiment, a semiconductor device may include a semiconductor layer having a relatively uniform thickness, and this may make it possible to prevent or suppress a leakage current from being formed between a source/drain pattern and a gate electrode.

While example embodiments have been particularly shown and described, it will be understood by one of ordinary skill in the art that variations of the embodiments in form and detail may be made therein without departing from the spirit and scope of the disclosure including the attached claims.

What is claimed is:

1. A semiconductor device, comprising:
    a substrate comprising an active pattern;
    a source/drain pattern on the active pattern;
    a gate electrode on the active pattern; and
    a gate spacer on the source/drain pattern,
    wherein the source/drain pattern comprises a first semiconductor layer on the active pattern and a second semiconductor layer on the first semiconductor layer,
    wherein the first semiconductor layer comprises a first inner sidewall and a second inner sidewall on opposite sides of the second semiconductor layer, and
    wherein, in a plan view, a distance between the first and second inner sidewalls of the first semiconductor layer decreases as positions of two portions of the first semiconductor layer where the distance is measured become closer to the gate spacer.

2. The semiconductor device of claim 1, further comprising semiconductor patterns, which are on the first semiconductor layer and are spaced apart from the second semiconductor layer.

3. The semiconductor device of claim 2, wherein the gate spacer comprises:
    an upper portion disposed at a level higher than a top surface of the uppermost one of the semiconductor patterns; and
    a lower portion disposed at a level lower than the top surface of the uppermost one of the semiconductor patterns.

4. The semiconductor device of claim 3, wherein the distance between the first and second inner sidewalls of the first semiconductor layer decreases according as the positions of the two portions of the first semiconductor layer where the distance is measured become closer to the lower portion of the gate spacer decreases.

5. The semiconductor device of claim 1, wherein each of the first and second inner sidewalls of the first semiconductor layer has a convex shape in an opposite direction of the second semiconductor layer.

6. The semiconductor device of claim 1, wherein the first semiconductor layer comprises an intrinsic semiconductor material without p-type or n-type impurities, and
    wherein the second semiconductor layer comprises one or more n-type impurities.

7. The semiconductor device of claim 6, wherein the first semiconductor layer comprises Si, SiGe, SiC, or SiGeC, and
    wherein the second semiconductor layer comprises SiAs, SiP, or SiSb.

8. The semiconductor device of claim 1, wherein the gate spacer comprises a first gate spacer and a second gate spacer on the source/drain pattern,
    wherein the first gate spacer comprises an upper portion and first and second lower portions, which are spaced apart from each other with the source/drain pattern interposed therebetween, and
    wherein the second gate spacer comprises an upper portion, and first and second lower portions, which are spaced apart from each other with the source/drain pattern interposed therebetween.

9. The semiconductor device of claim 8, wherein the first inner sidewall of the first semiconductor layer comprises a first portion connected to the first lower portion of the first gate spacer, a second portion connected to the second lower portion of the first gate spacer, and a third portion between the first and second portions of the first inner sidewall of the first semiconductor layer,
    wherein the second inner sidewall of the first semiconductor layer comprises a first portion connected to the first lower portion of the second gate spacer, a second portion connected to the second lower portion of the second gate spacer, and a third portion between the first and second portions of the second inner sidewall of the first semiconductor layer, and
    wherein a distance between the first portion of the first inner sidewall of the first semiconductor layer and the first portion of the second inner sidewall of the first semiconductor layer is smaller than a distance between the third portion of the first inner sidewall of the first semiconductor layer and the third portion of the second inner sidewall of the first semiconductor layer.

10. The semiconductor device of claim 9, wherein a distance between the second portion of the first inner sidewall of the first semiconductor layer and the second portion of the second inner sidewall of the first semiconductor layer is smaller than the distance between the third portion of the first inner sidewall of the first semiconductor layer and the third portion of the second inner sidewall of the first semiconductor layer.

11. The semiconductor device of claim 9, wherein the first to third portions of the first inner sidewall of the first semiconductor layer and the first to third portions of the second inner sidewall of the first semiconductor layer are located at substantially the same level.

12. The semiconductor device of claim 1, wherein the second semiconductor layer comprises a lower portion, a first sidewall portion on the first inner sidewall of the first semiconductor layer, and a second sidewall portion on the second inner sidewall of the first semiconductor layer.

13. The semiconductor device of claim 12, wherein a thickness of the lower portion of the second semiconductor layer is greater than a thickness of each of the first and second sidewall portions of the second semiconductor layer.

14. The semiconductor device of claim 12, wherein the first semiconductor layer comprises a contact surface on the gate spacer, and wherein a width of the contact surface of the first semiconductor layer is greater than a thickness of each of the first and second sidewall portions of the second semiconductor layer.

15. A semiconductor device, comprising:
a substrate comprising an active pattern;
semiconductor patterns on the active pattern;
a first semiconductor layer on the semiconductor patterns;
a second semiconductor layer on the first semiconductor layer; and
a gate electrode overlapping the semiconductor patterns,
wherein the first semiconductor layer comprises an inner sidewall on the second semiconductor layer, and
wherein, in a plan view, the inner sidewall of the first semiconductor layer has a convex shape in an opposite direction of the second semiconductor layer.

16. The semiconductor device of claim 15, wherein the first semiconductor layer comprises an outer sidewall on the semiconductor patterns,
wherein the outer sidewall of the first semiconductor layer has a convex shape in the direction opposite to the second semiconductor layer.

17. The semiconductor device of claim 16, wherein a distance between the outer and inner sidewalls of the first semiconductor layer is uniform.

18. The semiconductor device of claim 16, wherein the first semiconductor layer comprises a material composition different from the second semiconductor layer.

19. The semiconductor device of claim 16, further comprising a third semiconductor layer on the second semiconductor layer,
wherein the second semiconductor layer comprises an inner sidewall on the third semiconductor layer, and
wherein the inner sidewall of the second semiconductor layer comprises a first portion having a concave shape and a second portion having a convex shape in an opposite direction of the first semiconductor layer.

20. A semiconductor device, comprising:
a substrate comprising a first active pattern and a second active pattern;
a first source/drain pattern on the first active pattern;
a second source/drain pattern on the second active pattern;
a first gate spacer on the first and second source/drain patterns; and
a second gate spacer on the first and second source/drain patterns,
wherein the first gate spacer comprises an upper portion and first and second lower portions, which are spaced apart from each other with the first source/drain pattern interposed therebetween,
wherein the second gate spacer comprises an upper portion and first and second lower portions, which are spaced apart from each other with the first source/drain pattern interposed therebetween,
wherein the first source/drain pattern comprises a first semiconductor layer on the first active pattern and a second semiconductor layer on the first semiconductor layer,
wherein the first semiconductor layer comprises a first inner sidewall and a second inner sidewall on the second semiconductor layer,
wherein the first inner sidewall of the first semiconductor layer comprises a first portion on the first lower portion of the first gate spacer, a second portion on the second lower portion of the first gate spacer, and a third portion between the first and second portions of the first inner sidewall of the first semiconductor layer,
wherein the second inner sidewall of the first semiconductor layer comprises a first portion on the first lower portion of the second gate spacer, a second portion on the second lower portion of the second gate spacer, and a third portion between the first and second portions of the second inner sidewall of the first semiconductor layer, and
wherein a distance between the first portion of the first inner sidewall of the first semiconductor layer and the first portion of the second inner sidewall of the first semiconductor layer is smaller than a distance between the third portion of the first inner sidewall of the first semiconductor layer and the third portion of the second inner sidewall of the first semiconductor layer.

* * * * *